(12) United States Patent
Okamoto et al.

(10) Patent No.: US 9,136,286 B2
(45) Date of Patent: Sep. 15, 2015

(54) DISPLAY PANEL AND ELECTRONIC BOOK

(75) Inventors: Satohiro Okamoto, Shizuoka (JP); Takafumi Mizoguchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 471 days.

(21) Appl. No.: 12/849,951

(22) Filed: Aug. 4, 2010

(65) Prior Publication Data
US 2011/0032223 A1  Feb. 10, 2011

(30) Foreign Application Priority Data

Aug. 7, 2009 (JP) .................................. 2009-184308

(51) Int. Cl.
| | |
|---|---|
| *H01L 27/12* | (2006.01) |
| *G02F 1/167* | (2006.01) |
| *G02F 1/1333* | (2006.01) |
| *G02F 1/1345* | (2006.01) |
| *H01L 51/52* | (2006.01) |
| *H01L 27/32* | (2006.01) |
| *G02F 1/1335* | (2006.01) |

(Continued)

(52) U.S. Cl.
CPC ...... H01L 27/1251 (2013.01); G02F 1/133308 (2013.01); G02F 1/167 (2013.01); H01L 27/1266 (2013.01); *G02F 1/1336* (2013.01); *G02F 1/13452* (2013.01); *G02F 1/133305* (2013.01); *G02F 1/136204* (2013.01); *G02F 2001/13613* (2013.01); *G02F 2001/13685* (2013.01); *G02F 2001/133311* (2013.01); *G02F 2001/133322* (2013.01); *G02F 2001/133342* (2013.01); *G02F 2001/133357* (2013.01); *G02F 2001/133388* (2013.01); *G02F 2001/136295* (2013.01); *G02F 2201/44* (2013.01); *G02F 2201/48* (2013.01); *G02F 2201/50* (2013.01); *G02F 2201/503* (2013.01); *G02F 2201/54* (2013.01); *G09G 2380/02* (2013.01); *H01L 27/3244* (2013.01); *H01L 51/5237* (2013.01); *H01L 2227/326* (2013.01); *H01L 2251/5338* (2013.01)

(58) Field of Classification Search
USPC ..................................................... 359/296
See application file for complete search history.

(56) References Cited

U.S. PATENT DOCUMENTS

| | | |
|---|---|---|
| 4,165,157 A | 8/1979 | Kobale et al. |
| 5,075,166 A | 12/1991 | Sikorski et al. |

(Continued)

FOREIGN PATENT DOCUMENTS

| | | |
|---|---|---|
| EP | 1 276 090 A1 | 1/2003 |
| EP | 1 970 952 A2 | 9/2008 |

(Continued)

*Primary Examiner* — Kent Chang
*Assistant Examiner* — Nathan Brittingham
(74) *Attorney, Agent, or Firm* — Husch Blackwell LLP

(57) ABSTRACT

It is an object to provide a display panel and an electronic book which are manufactured with high yield and have high reliability. A display panel is provided which includes, a flexible display portion in which a scan line and a signal line intersect with each other over a substrate, a signal line driver circuit for outputting a first signal to the signal line adjacent to a first side of the flexible display portion over the substrate, and a scan line driver circuit for outputting a second signal to the scan line adjacent to a second side of the flexible display portion. In the display panel, the mechanical strength of a portion provided with the signal line driver circuit or the scan line driver circuit is improved as compared to the mechanical strength of other than the portion.

16 Claims, 15 Drawing Sheets

(51) Int. Cl.
  *G02F 1/1362* (2006.01)
  *G02F 1/136* (2006.01)
  *G02F 1/1368* (2006.01)

(56) References Cited

U.S. PATENT DOCUMENTS

| | | | |
|---|---|---|---|
| 5,256,130 A * | 10/1993 | Kachel et al. | 493/210 |
| 5,841,102 A | 11/1998 | Noddin | |
| 6,103,992 A | 8/2000 | Noddin | |
| 6,885,146 B2 | 4/2005 | Yamazaki et al. | |
| 7,154,452 B2 | 12/2006 | Nakamura et al. | |
| 7,378,791 B2 | 5/2008 | Yamazaki et al. | |
| 7,470,461 B2 | 12/2008 | Jang et al. | |
| 7,748,634 B1 * | 7/2010 | Zehr et al. | 235/492 |
| 7,808,098 B2 | 10/2010 | Sugiyama et al. | |
| 7,855,107 B2 | 12/2010 | Hara | |
| 7,869,119 B2 * | 1/2011 | Oikawa et al. | 359/296 |
| 8,558,370 B2 | 10/2013 | Sugiyama et al. | |
| 2002/0046880 A1 | 4/2002 | Takubo et al. | |
| 2003/0076460 A1 * | 4/2003 | Murade | 349/111 |
| 2003/0222334 A1 | 12/2003 | Ikeda et al. | |
| 2005/0233122 A1 | 10/2005 | Nishimura et al. | |
| 2008/0042940 A1 | 2/2008 | Hasegawa | |
| 2008/0049003 A1 | 2/2008 | Hasegawa | |
| 2008/0248609 A1 | 10/2008 | Yamazaki et al. | |
| 2008/0297496 A1 * | 12/2008 | Watson et al. | 345/206 |
| 2009/0278252 A1 | 11/2009 | Oikawa et al. | |
| 2010/0013372 A1 | 1/2010 | Oikawa et al. | |
| 2010/0129528 A1 | 5/2010 | Yamazaki et al. | |
| 2010/0171138 A1 | 7/2010 | Yamazaki et al. | |
| 2010/0295860 A1 * | 11/2010 | Somerville et al. | 345/545 |
| 2011/0001146 A1 | 1/2011 | Yamazaki et al. | |

FOREIGN PATENT DOCUMENTS

| | | |
|---|---|---|
| EP | 2 372 756 A1 | 10/2011 |
| JP | 2001-312250 A | 11/2001 |
| JP | 2003-337353 | 11/2003 |
| JP | 2003-345267 A | 12/2003 |
| JP | 2008-021939 A | 1/2008 |
| JP | 2008-046565 A | 2/2008 |
| JP | 2008-052040 A | 3/2008 |
| JP | 2008-262547 A | 10/2008 |
| JP | 2009-109806 A | 5/2009 |

* cited by examiner

FIG. 8A-1
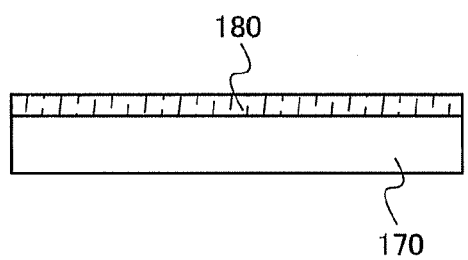
FIG. 8A-2
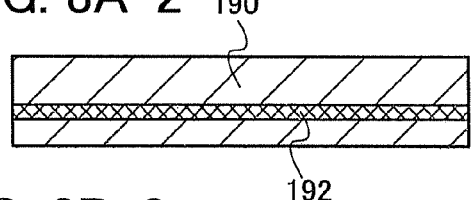
FIG. 8B-2
FIG. 8C-2
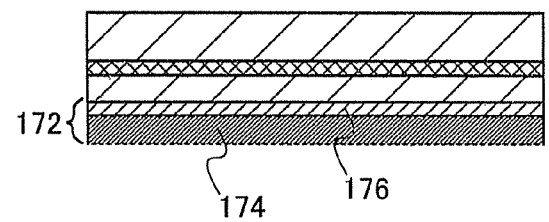
FIG. 8D
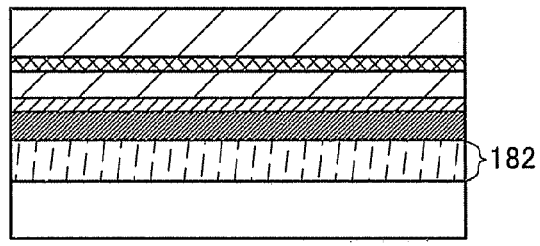
FIG. 8E
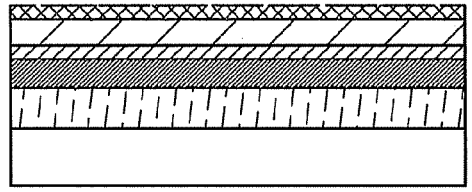
FIG. 8F
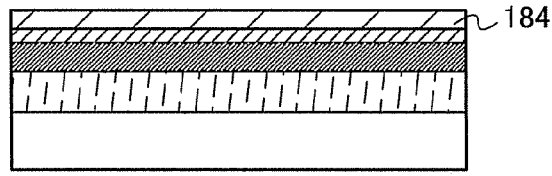

FIG. 10A-1
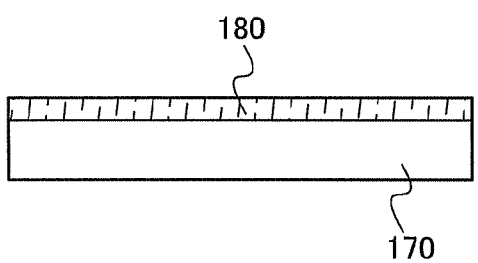
FIG. 10A-2
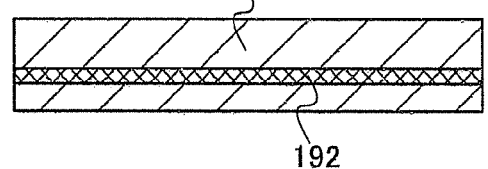
FIG. 10B-2
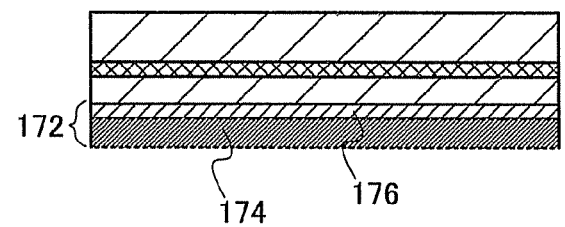
FIG. 10C-2
FIG. 10D
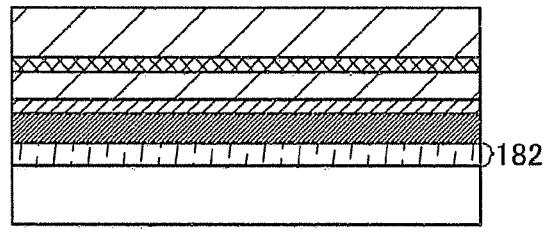
FIG. 10E
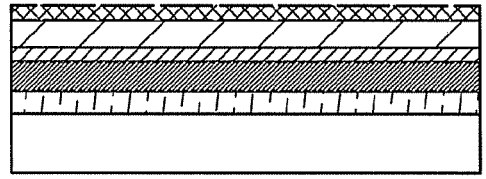
FIG. 10F
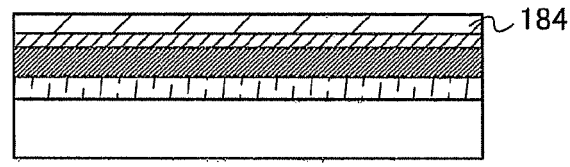

DISPLAY PANEL AND ELECTRONIC BOOK

BACKGROUND OF THE INVENTION

1. Field of the Invention

The present invention relates to a display panel and an electronic book.

2. Description of the Related Art

In recent years, with the development of digitization techniques, a service in which textual information and image information of newspapers, magazines, and the like are provided in the form of electronic data has been in widespread use. In such a service, electronic data is displayed on a display device in a PC or the like, whereby the content is seen.

As a display device providing such a service, for example, electronic paper with flexibility has been proposed (see Patent Document 1). In the case where a display portion of the electronic paper with flexibility is formed using an element such as a transistor, a circuit for driving the transistor (hereinafter referred to as a driver circuit) needs to be provided. In this case, bending of the electronic paper might break the driver circuit.

REFERENCE

Patent Document

[Patent Document 1] Japanese Published Patent Application No. 2003-337353

SUMMARY OF THE INVENTION

An object of an embodiment of the present invention is to provide a display panel and an electronic book which are manufactured with high yield and have high reliability. In particular, an object of an embodiment of the present invention is to provide a display panel, a display device, and an electronic book which have flexibility such that a driver circuit is hardly broken.

An embodiment of the present invention is a display panel and an electronic book in which the strength of a driver circuit portion, a portion where stress is concentrated by bending, or the like is increased.

Note that a display panel includes, in its category, electronic paper, a light-emitting device, and a liquid crystal display device. A light-emitting device includes a light-emitting element, and a liquid crystal display device includes a liquid crystal element. A light-emitting element includes, in its category, an element whose luminance is controlled by current or voltage, and specifically an inorganic electroluminescent (EL) element, an organic EL element, and the like.

A display panel, a display device, and an electronic book which have high mechanical strength and high reliability can be provided.

A display panel, a display device, and an electronic book can be manufactured with high yield.

BRIEF DESCRIPTION OF THE DRAWINGS

FIGS. 5A-1, 5A-2, 5B-1, 5B-2, 5C-1, 5D, 5E, and 5F illustrate a method for manufacturing a substrate used for a display panel which is an embodiment of the present invention.

FIGS. 6A-1, 6A-2, 6B-1, 6B-2, 6C, 6D, and 6E illustrate a method for manufacturing a substrate used for a display panel which is an embodiment of the present invention.

FIGS. 7A-1, 7A-2, 7B-1, 7C-1, 7D, 7E, and 7F illustrate a method for manufacturing a substrate used for a display panel which is an embodiment of the present invention.

FIGS. 8A-1, 8A-2, 8B-2, 8C-2, 8D, 8E, and 8F illustrate a method for manufacturing a substrate used for a display panel which is an embodiment of the present invention.

FIGS. 9A-1, 9A-2, 9B-2, 9C-2, 9D, 9E, and 9F illustrate a method for manufacturing a substrate used for a display panel which is an embodiment of the present invention.

FIGS. 10A-1, 10A-2, 10B-2, 10C-2, 10D, 10E and 10F illustrate a method for manufacturing a substrate used for a display panel which is an embodiment of the present invention.

DETAILED DESCRIPTION OF THE INVENTION

Figure 1:
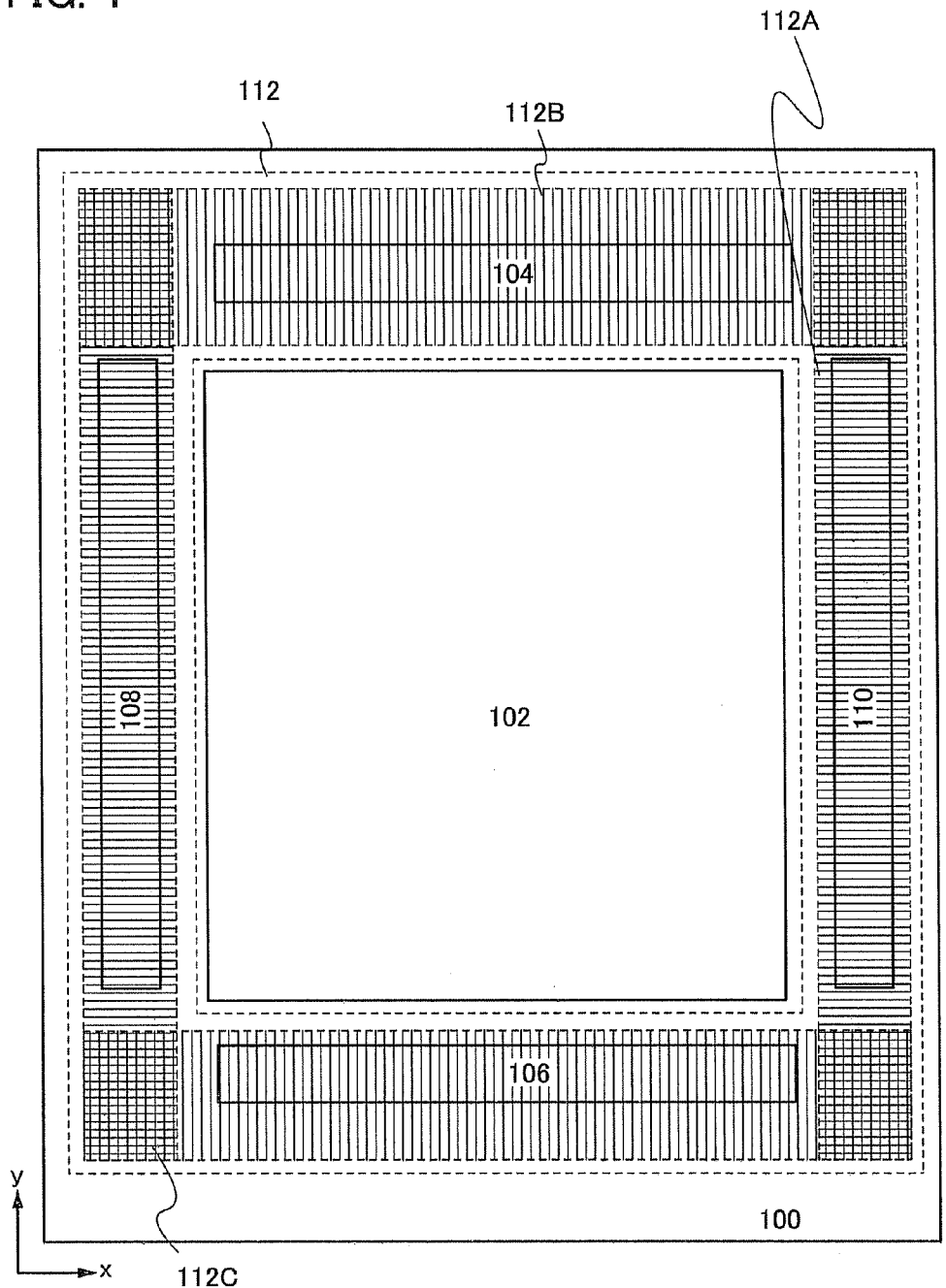
FIG. 1 illustrates a display panel which is an embodiment of the present invention.

Hereinafter, embodiments of the present invention will be described in detail with reference to drawings. Note that the present invention is not limited to the description below, and it is easily understood by those skilled in the art that a variety of changes and modifications can be made without departing from the spirit and scope of the present invention. Accordingly, the present invention should not be construed as being limited to the description of the embodiments below. In describing structures of the present invention with reference to drawings, the same reference numerals are used in common for the same portions in different drawings. Note that the same hatch pattern is applied to similar parts, and the similar parts are not especially denoted by reference numerals in some cases. In addition, an insulating layer is not illustrated in a top plan view for convenience in some cases. Note that the size, the layer thickness, or the region of each structure illustrated in each drawing is exaggerated for clarity in some cases and thus the actual scale is not necessarily limited to the illustrated scale. Therefore, the present invention is not necessarily limited to such scales illustrated in the drawings.

Embodiment 1

In this embodiment, a display panel which is an embodiment of the present invention will be described.

An embodiment of the present invention is a display panel including a rectangular sheet-like flexible display panel having a display portion in which a scan line and a signal line intersect with each other. The flexible display panel further includes, over a substrate provided with the display panel, a signal line driver circuit for outputting a signal to the signal line, which is provided in at least one of a side of the flexible display panel and a side opposite to the side of the flexible display panel. Here, the sides correspond to sides in a top view. The flexible display panel further includes, over the substrate, a scan line driver circuit for outputting a signal to the scan line, which is provided in at least one of a side of the flexible display panel and a side opposite to the side of the flexible display panel and is approximately perpendicular to the signal line driver circuit. In the display panel, a portion overlapping with the signal line driver circuit or the scan line driver circuit has a higher mechanical strength than a region other than the overlapping portion.

An embodiment of the present invention is a rectangular sheet-like flexible display panel including a display portion in which a scan line and a signal line intersect with each other. The flexible display panel further includes, over a substrate provided with the display panel, a signal line driver circuit for outputting a signal to the signal line, which is provided in at least one of a side of the flexible display panel and a side opposite to the side of the flexible display panel. Here, the sides correspond to sides in a top view. The flexible display panel further includes, over the substrate, a scan line driver circuit for outputting a signal to the scan line, which is provided in at least one of a side of the flexible display panel and a side opposite to the side of the flexible display panel and is approximately perpendicular to the signal line driver circuit. In the display panel, a region in a vicinity of four sides has a higher mechanical strength than a region other than the region in the vicinity of the four sides.

In the display panel with the above-described structure, the display panel may be covered with a film, and the film covering the region having a high mechanical strength may be thick.

In the display panel with the above-described structure, a prepreg overlapping with the region having the high mechanical strength may be provided.

In the display panel with the above-described structure, a first prepreg may be formed over an entire surface of the display panel, and a second prepreg overlapping with the region having the high mechanical strength may be provided. At this time, the second prepreg is preferably formed using thinner fibers than the first prepreg.

In the display panel including a region in a vicinity of four sides which has a higher mechanical strength than a region other than the region in the vicinity of the four sides, vicinities of four corners of the display panel preferably have a higher mechanical strength than the vicinity of the four sides except the vicinities of four corners.

In the display panel with the above-described structure, one of or both the signal line driver circuit and the scan line driver circuit is preferably provided with a thin film transistor formed using a single crystal semiconductor layer.

Note that "rectangular" shape or "rectangular sheet-like" shape includes a shape which is formed by four lines and has a curve but no sharp corner. That is, the "rectangular" shape in this specification includes a rounded rectangle.

Note that in this embodiment, the terms "over" and "on" mean a direction in which a thin film or the like is formed, with respect to a substrate. Therefore, in a diagram illustrating a structure in which a substrate is provided in the uppermost level and a thin film or the like is formed under the substrate, the structure is described such that the thin film is formed "over" or "on" the substrate in the description hereinafter.

FIG. 1 is a schematic view of a structure of a display panel which is an embodiment of the present invention.

A display panel 100 illustrated in FIG. 1 includes a display portion 102, a first scan line driver circuit 104, a second scan line driver circuit 106, a first signal line driver circuit 108, and a second signal line driver circuit 110. Note that only one of the first scan line driver circuit 104 and the second scan line driver circuit 106 may be provided. Similarly, only one of the first signal line driver circuit 108 and the second signal line driver circuit 110 may be provided. The display panel 100 is provided over a flexible substrate such as a plastic substrate and can be bended.

When the display panel 100 is bended, stress is likely to concentrate on a region provided with the first scan line driver circuit 104, the second scan line driver circuit 106, the first signal line driver circuit 108, and the second signal line driver circuit 110 illustrated in FIG. 1, which leads to damage to or a break in the display panel. Thus, the concentration of stress becomes one of causes of reduction in yield and reliability.

Thus, in accordance with an embodiment of the present invention, a display panel is improved in yield and reliability by increasing the mechanical strength of a region on which stress is likely to concentrate when the panel is bended. In particular, a resin layer provided in a reinforced region 112 surrounded by dotted lines in FIG. 1 is formed thick. Further, the display panel 100 is covered with a film or the like, so that a part of the film overlapping with the reinforced region 112 is formed thick.

Preferably, a prepreg, which is a structure body in which a fiber is impregnated with an organic resin, is provided to overlap with the reinforced region 112. Thus, the mechanical strength of the reinforced region 112 which is likely to have the greatest concentration of stress in the bended panel, can be further increased.

Still preferably, a prepreg may be provided over an entire surface of the display panel 100 to further increase the mechanical strength of the reinforced region 112. In order to further reinforce the reinforced region 112 effectively, for example, thin prepregs may be closely arranged (i.e., the number of fibers per unit area may be increased) over the reinforced region 112. With the use of the thin prepregs which are closely arranged, a stress is easily dispersed. Thus, the mechanical strength of the reinforced region 112 can be effectively increased.

Note that when a prepreg is provided over the entire surface of the display panel 100 as described above, the display characteristics of the display panel are easily degraded. Therefore, it is preferable to provide a prepreg only on a rear surface of a single-sided display panel that displays an image only on a single side (only over a surface opposite to a display surface).

Note that as shown in FIG. 1, the reinforced region 112 can be divided into the following regions: first reinforced regions 112A each extending in a y direction (a horizontally hatched region in FIG. 1), second reinforced regions 112B each extending in a x direction (a vertically hatched region in FIG. 1), and third reinforced regions 112C each existing in the vicinity of four corners (a region at which the first reinforced region 112A and the second reinforced region 112B intersect with each other). The third reinforced region 112C is a place which is likely to have the greatest concentration of stress in the bended panel. Therefore, it is preferable that fibers extending in the y direction be provided in the first reinforced region 112A, that fibers extending in the x direction be provided in the second reinforced region 112B, and that the fibers intersect with each other in the third reinforced region 112C.

Alternatively, fibers extending in the x direction may be provided in the first reinforced region 112A; fibers extending in the y direction may be provided in the second reinforced region 112B; and the fibers extending and intersecting with each other may be provided in the third reinforced region 112C. With such a structure, the first reinforced region 112A is easily bended in the y direction, and the second reinforced region 112B is easily bended in the x direction. Therefore, the mechanical strength of the display panel 100 can be increased without reduction in the degree of flexibility of the display panel 100.

Next, a display element used for the display panel 100 is described. As a display panel which is an embodiment of the present invention, electronic paper, a light-emitting display panel (electroluminescence (EL) panel), a liquid crystal display panel, or the like can be used, and the display panel which is an embodiment of the present invention is not limited to a particular one. The display portion 102 of the display panel 100 may be either a passive matrix type or an active matrix type. In the description to be given below, an active matrix type display portion is described.

Note that here, "electronic paper" refers to a display which is thin and lightweight and has high visibility, like paper. Note that examples of electronic paper include a device which performs display with the use of molecules utilizing optical anisotropy, dye molecular orientation, or the like; a device which performs display with the use of particles utilizing electrophoresis, particle movement, particle rotation, phase change, or the like; a device which performs display by moving one end of a film; a device using coloring properties or phase change of molecules; a device using optical absorption by molecules; and a device using self-light emission by combining electrons and holes. For example, the following can be used for a display method of electronic paper: microcapsule electrophoresis, horizontal electrophoresis, vertical electrophoresis, a spherical twist ball, a magnetic twist ball, a columnar twist ball, a charged toner, Electro Liquid Powder (registered trademark), magnetic electrophoresis, a magnetic thermosensitive type, an electrowetting type, a light-scattering (transparent-opaque change) type, a cholesteric liquid crystal and a photoconductive layer, a cholesteric liquid crystal, a bistable nematic liquid crystal, a ferroelectric liquid crystal, a liquid crystal dispersed type with a dichroic dye, a movable film, coloring and decoloring properties of a leuco dye, a photochromic material, an electrochromic material, an electrodeposition material, flexible organic EL, and the like. Note that the present invention is not limited to these, and a variety of electronic paper and display methods of electronic paper can be used. Here, when microcapsule electrophoresis is used, defects of an electrophoresis method, which are aggregation and precipitation of phoresis particles, can be solved. Electro Liquid Powder (registered trademark) has advantages such as high-speed response, high reflectivity, wide viewing angle, low power consumption, and memory properties. Note that in a broad sense, electronic paper includes, in its category, a device using a liquid crystal element or a light-emitting element as a display element. However, in this embodiment, the device using a display element other than a liquid crystal element or a light-emitting element is referred to as electronic paper. In electronic paper, the shape or the position of a display medium is changed, for example, with the use of an electric field, a magnetic field, light, or heat, so that the electronic paper can display an image. Examples of an electronic paper system include a twist ball method, an electrophoresis method, a thermal rewritable method, a toner display method, and a method using an electronic powder and grain.

Note that the display panel 100 may be either a dual display panel that displays images on both sides or a single-sided display panel that displays images only on one side. As the dual display panel, a dual-emission display panel may be used or rear surfaces of two single-sided display panels may be attached to each other and used. In the case where two single-sided display panels are attached and used, a backlight may be interposed between the two single-sided display panels. As the backlight, an EL display panel provided over a flexible substrate is preferably used because the degree of flexibility is not reduced by the EL display panel.

Note that, as described above, in the case of using a single-sided display panel for the display panel 100, it is preferable that a prepreg be provided only on a rear surface of a display surface in order not to degrade display characteristics.

Figure 2A:
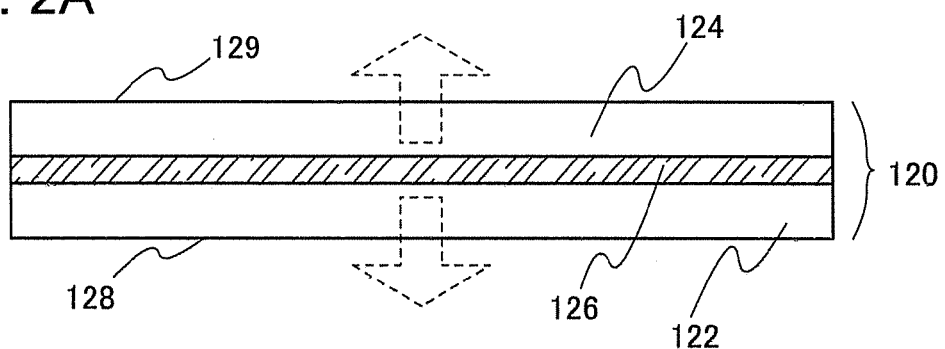
FIGS. 2A to 2C each illustrate a display panel which is an embodiment of the present invention.
Figure 2B:
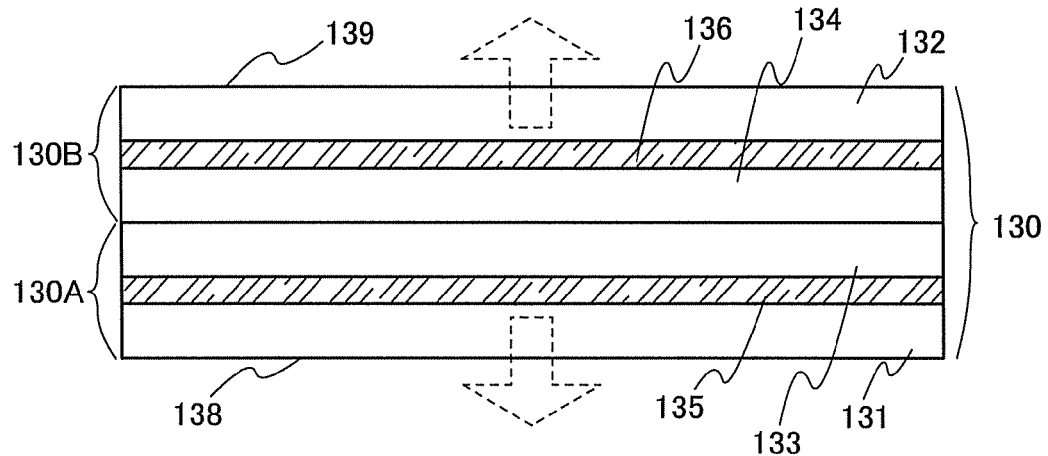
Figure 2C:
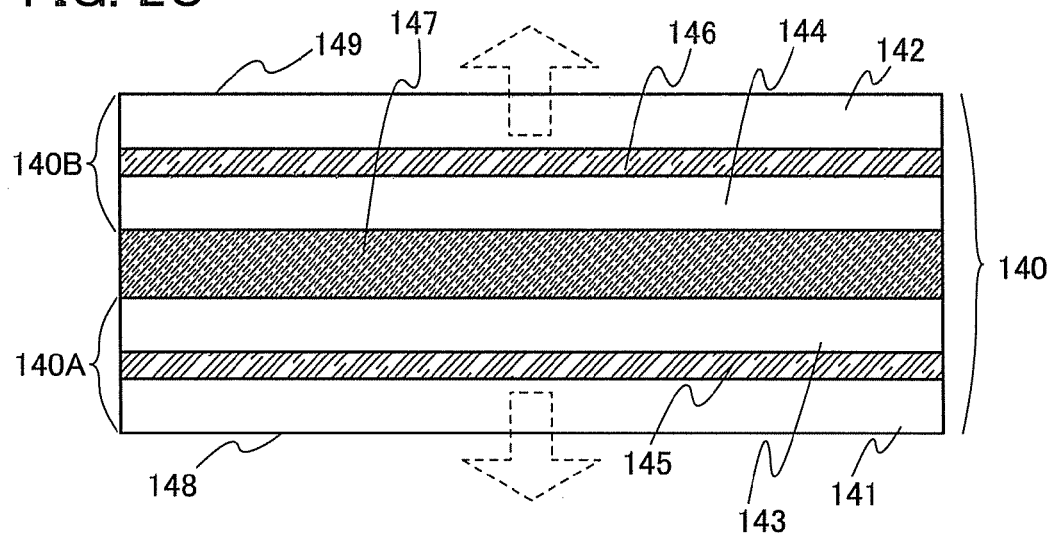

FIGS. 2A to 2C illustrate examples of a dual display panel which is applicable to the display panel 100. Note that in each of FIGS. 2A to 2C, dotted arrows indicate directions of a viewer side (a display surface side).

FIG. 2A illustrates a side surface of a display panel 120 in which a display element 126 is interposed between a substrate 122 and a substrate 124. In the display panel, a first display portion 128 is provided on the substrate 122 side and a second display portion 129 is provided on the substrate 124 side. In order to display images on the first display portion 128 and the second display portion 129 with the display element 126, the substrate 122 and the substrate 124 are formed using a substrate having a light-transmitting property. It is preferable that an EL element that is a self-light-emitting element be used as the display element 126. Note that with the use of light entering the display panel 120, a liquid crystal display element or an electrophoretic display element can be used as the display element 126.

FIG. 2B illustrates a side surface of a display panel 130 in which a single-sided display panel 130A including a display element 135 interposed between a substrate 131 and a substrate 133 and a single-sided display panel 130B including a display element 136 interposed between a substrate 132 and a substrate 134 are attached to each other. In the display panel, a first display portion 138 is provided on the substrate 131 side, and a second display portion 139 is provided on the substrate 132 side. In order to display an image on the first display portion 138 with the display element 135 and to display an image on the second display portion 139 with the display element 136, the substrate 131 and the substrate 132 are formed using substrates each having a light-transmitting property. The substrate 133 and the substrate 134 do not necessarily have a light-transmitting property. The substrate 133 and the substrate 134 may have a reflecting property. Further, light-shielding layers may be provided between the substrate 133 and the display element 135 and between the substrate 134 and the display element 136. Although not shown, the single-sided display panel 130A and the single-sided display panel 130B may be attached to each other with an adhesive layer interposed therebetween, for example. Further, either one of the substrate 133 and the substrate 134 may be used. That is, one main surface of the substrate may be provided with the display element 135 and a rear surface of the one main surface (a surface opposite to the one main surface thereof) may be provided with the display element 136. As each of the display element 135 and the display element 136, an EL element which is a self-light-emitting element is preferably used. With the use of light entering the display panel 130, a liquid crystal display element and an electrophoretic display element can be used as the display element 135 and the display element 136. At this time, in order to enhance the light extraction efficiency, a reflective display panel is preferably used as the single-sided display panel.

Further, a backlight may be interposed between transmissive liquid crystal display panels. FIG. 2C illustrates a side surface of a display panel 140 in which a transmissive liquid crystal display panel 140A including a display element 145 interposed between a substrate 141 and a substrate 143 and a transmissive liquid crystal display panel 140B including a display element 146 interposed between a substrate 142 and a substrate 144 are attached to each other, with a backlight 147 to be a light source interposed therebetween. In the display panel, a first display portion 148 is provided on the substrate 141 side, and a second display portion 149 is provided on the substrate 142 side. The transmittance of light emitted from the backlight 147 is controlled by the display element 145, whereby an image is displayed on the first display portion 148. The transmittance of light emitted from the backlight 147 is controlled by the display element 146, whereby an image is displayed on the second display portion 149. In order to perform such display, each of the substrate 141, the substrate 142, the substrate 143, and the substrate 144 is formed using a substrate having a light-transmitting property. Note that the two transmissive liquid crystal display panels, the transmissive liquid crystal display panel 140A and the transmissive liquid crystal display panel 140B, and the backlight 147 may be attached to each other with an adhesive layer interposed therebetween. It is preferable to use a thin EL panel as the backlight 147 because the display panel 140 can be made thin.

Electronic paper, a liquid crystal display panel, or a light-emitting display panel is applicable to a display panel which is an embodiment of the present invention. Display panels of these are described below.

First, the case of using electronic paper as a display panel is described.

Figure 3A:
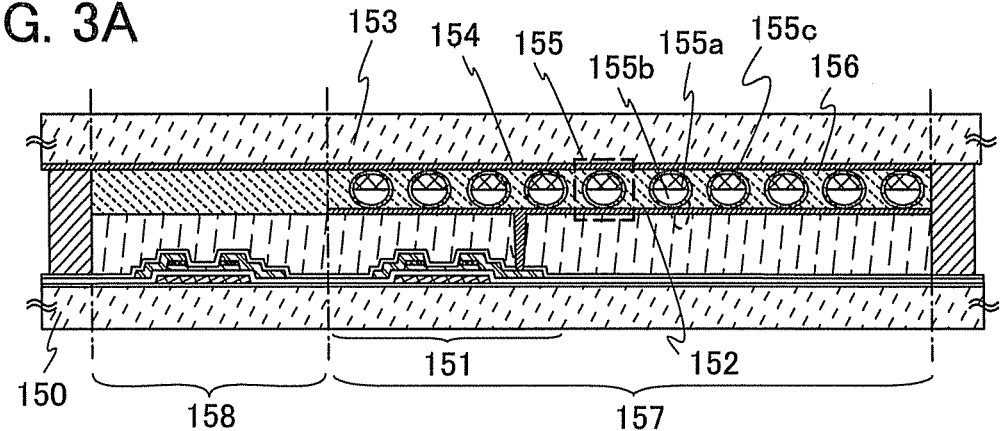
FIGS. 3A to 3C each illustrate a display panel which is an embodiment of the present invention.
Figure 3B:
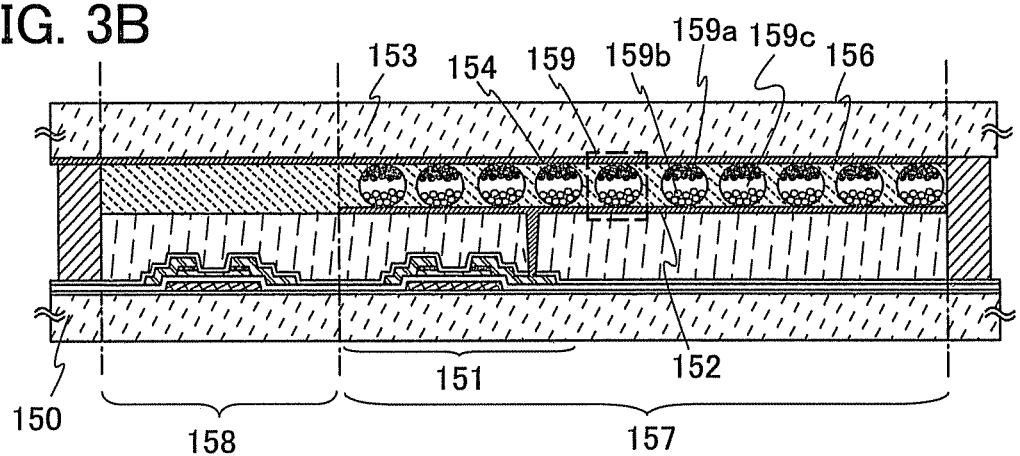
Figure 3C:
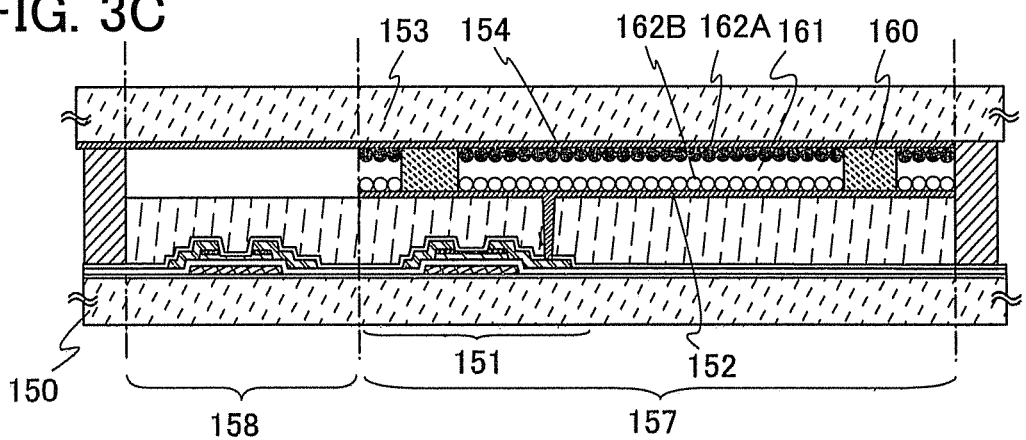

FIGS. 3A to 3C are cross-sectional views of display panels using an active matrix type electronic paper. Electronic paper has visibility as high as paper, consumes lower power than other display panels, and can be made thin and lightweight.

FIG. 3A is a cross-sectional view of electronic paper using a twist ball method. A twist ball method is a method in which spherical particles each colored in black and white are arranged between electrodes included in a display element and the orientation of the spherical particles is controlled with the use of voltage between the electrodes to display an image.

Electronic paper using a twist ball method which is illustrated in FIG. 3A includes a display portion 157 and a driver circuit portion 158. The display portion 157 includes a first electrode layer 152 connected to a thin film transistor 151 over a substrate 150, a second electrode layer 154 provided over a substrate 153, and spherical particles 155 arranged between the first electrode layer 152 and the second electrode layer 154. The spherical particles 155 each include a black region 155a, a white region 155b, and a cavity 155c filled with a liquid around the black region and the white region. A space around the spherical particles 155 is filled with a filler 156 such as an organic resin. The second electrode layer 154 corresponds to a common electrode (a counter electrode) and is electrically connected to a common potential line. Note that the driver circuit portion 158 includes a thin film transistor formed through the same process as the thin film transistor 151 in the display portion 157.

FIG. 3B is a cross-sectional view of electronic paper using an electrophoretic element method. In FIG. 3B, microcapsules 159 are used instead of the spherical particles 155 in FIG. 3A. The microcapsules 159 each include a transparent liquid 159c, black particles 159a, and white particles 159b.

In the microcapsules 159 provided between the first electrode layer 152 and the second electrode layer 154, when an electric field is generated by the first electrode layer 152 and the second electrode layer 154, the white particles 159b as first particles and the black particles 159a as second particles move in opposite directions, so that white or black can be displayed. Such a display element is referred to as an electrophoretic display element. An electrophoretic display element has high reflectivity, and thus, an auxiliary light is unnecessary, power consumption is low, and high visibility is provided even in a dim place. Moreover, an image which has been displayed once can be retained even if no power is supplied to the display portion.

Note that the first particles and the second particles each include a pigment, and do not move when there is no potential gradient. The colors of the first particles and the second particles are not limited to black and white, and any color may be used for the first particles and the second particles as long as the colors of the first particles and the second particles are different from each other (the colors include achromatic color).

A solution in which the aforementioned microcapsules are dispersed in a solvent is referred to as electronic ink. This electronic ink can be printed on a surface of glass, plastic, cloth, paper, or the like. Note that color display is also possible with the use of a color filter or particles including a coloring matter.

Note that the first particles and the second particles in the microcapsules 159 may be formed using a single material selected from a conductive material, an insulating material, a semiconductor material, a magnetic material, a liquid crystal material, a ferroelectric material, an electroluminescent material, an electrochromic material, and a magnetophoretic material, or formed using a composite material of any of these.

FIG. 3C is a cross-sectional view of electronic paper using a method using an electronic powder and grain. In FIG. 3C, positively charged black powder and granular materials 162A and negatively charged white powder and granular materials 162B are contained in a space 161 enclosed with the first electrode layer 152, the second electrode layer 154, and ribs 160. The space 161 may be filled with the air, for example.

With a potential gradient generated by the first electrode layer 152 and the second electrode layer 154, the black powder and granular materials 162A and the white powder and granular materials 162B move in opposite directions, so that white or black can be displayed. As the powder and granular materials, color powders such as red, yellow, and/or blue color powders may be used. The use of color powders enables color display.

Alternatively, a light-emitting element using electroluminescence (an EL element) may be used as the display element. Light-emitting elements utilizing electroluminescence are roughly classified according to whether a light-emitting material is an organic compound or an inorganic compound. In general, the former is referred to as organic EL elements and the latter as inorganic EL elements.

In an organic EL element, by application of voltage to a light-emitting element provided using a light-emitting organic compound, electrons and holes are separately injected from a pair of electrodes into a layer including a light-emitting organic compound, so that current flows. Then, electrons and holes are recombined, whereby the light-emitting organic compound forms an excited state, and light is emitted when the excited state returns to a ground state. A light-emitting element which emits light with such a mechanism is called a light-emitting element of a current excitation type.

An inorganic EL element is classified as either a dispersion type inorganic EL element or a thin-film type inorganic EL element, depending on its element structure. A dispersion type inorganic EL element includes a light-emitting layer in which particles of a light-emitting material are dispersed in a binder, and light emission thereof is due to donor-acceptor recombination, in which a donor level and an acceptor level are utilized. The thin-film type inorganic EL element has a structure in which a light-emitting layer is interposed between dielectric layers and the light-emitting layer interposed between the dielectric layers is further interposed between electrodes. The light-emission mechanism of the thin-film type inorganic EL element is local light emission, in which inner-shell election transition of a metal ion is utilized. Note that an organic EL element is used as a light-emitting element for description.

In order to extract light emitted from the light-emitting element, at least one of an anode and a cathode may be transparent. To the display panel which is an embodiment of the present invention, any of light-emitting elements having any of the following structures may be employed: a top emission structure in which light emission is extracted from a side opposite to a substrate provided with an element, with the light-emitting element interposed between the substrates (extracted from the sealing substrate side); a bottom emission structure in which light emission is extracted from a side of a substrate provided with an element, with the light-emitting element interposed between the substrate and another substrate; and a dual emission structure in which light emission is extracted from both of the sides.

Figure 4A:
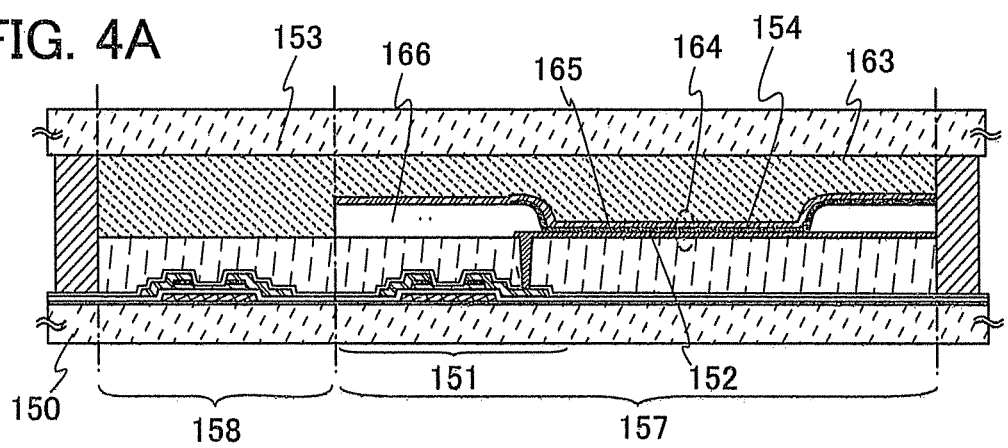
FIGS. 4A and 4B each illustrate a display panel which is an embodiment of the present invention.

FIG. 4A is a cross-sectional view of a structure in which a light-emitting display panel is used as the display panel 100. A light-emitting element 164 which is a display element is electrically connected to the thin film transistor 151 provided in the display portion 157. Note that the light-emitting element 164 has a structure in which the first electrode layer 152, an electroluminescence layer 165, and the second electrode layer 154 are stacked, but the structure is not limited to that illustrated in FIG. 4A. The structure of the light-emitting element 164 can be changed as appropriate depending on the direction in which light is extracted from the light-emitting element 164.

The electroluminescence layer 165 may be formed with either a single-layer structure or a stacked-layer structure of a plurality of layers.

A partition wall 166 is formed using an organic resin film, an inorganic insulating film, organic polysiloxane, or the like. In particular, it is preferable that the partition wall 166 be formed using a photosensitive material to have an opening portion over the first electrode layer 152 by exposure to light so that a sidewall of the opening portion is formed as a tilted surface with a continuous curve.

A protective layer may be formed over the second electrode layer 154 in order to prevent oxygen, hydrogen, moisture, carbon dioxide, or the like from entering the light-emitting element 164. As a material of the protective layer, silicon nitride, silicon nitride oxide, diamond like carbon (DLC), or the like can be used. A space enclosed with the substrate 150, the substrate 153, and a sealing material is filled with a filler 163 and is hermetically sealed. It is preferable that a panel be packed (sealed) with a protective film (such as a laminate film or an ultraviolet curable resin film) or a cover material with high air-tightness and little degasification so that the panel is not exposed to the outside air as described above.

As the filler 163, an inert gas such as nitrogen or argon can be used. Further, an ultraviolet curable resin, a thermosetting resin, polyvinyl chloride (PVC), acrylic, polyimide, an epoxy resin, a silicone resin, polyvinyl butyral (PVB), or ethylene vinyl acetate (EVA) can be used.

If necessary, an optical film such as a polarizing plate, a circularly polarizing plate (including an elliptically polarizing plate), a retardation plate (a quarter-wave plate or a half-wave plate), or a color filter may be provided for a light-emitting surface of the light-emitting element. For example, with the use of a white-light-emitting element and a color filter, light-emitting elements of different colors are not necessarily formed; thus, productivity can be improved. Further, a polarizing plate or a circularly polarizing plate may be provided with an anti-reflection film. For example, anti-glare treatment by which reflected light can be diffused by projections and depressions on the surface so as to reduce the glare can be performed.

Figure 4B:
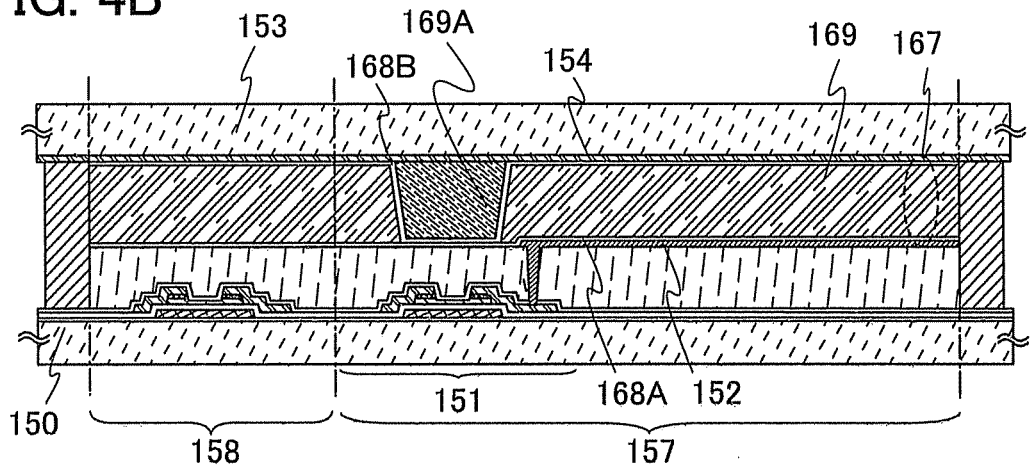

FIG. 4B is a cross-sectional view of a structure in which a liquid crystal display panel is used as the display panel 100. In FIG. 4B, a liquid crystal element 167 as a display element has a structure in which the first electrode layer 152 and the second electrode layer 154 sandwich a liquid crystal layer 169 with an orientation film 168A interposed between the first electrode layer 152 and the liquid crystal layer 169 and with an orientation film 168B interposed between the second electrode layer 154 and the liquid crystal layer 169. The second electrode layer 154 is provided on the substrate 153 side.

A spacer 169A can be formed by selective etching of an insulating film. The spacer is provided in order to control a film thickness of the liquid crystal layer 169 (a cell gap). Note that a spherical spacer may be used instead of the spacer 169A.

Although not illustrated in the liquid crystal display panel in FIG. 4B, a color filter layer (a coloring layer); a black matrix layer (a light-shielding layer); an optical member (an optical substrate) such as a polarizing member, a retardation member, or an anti-reflection member; and the like may be provided as appropriate. For example, circular polarization may be employed using a polarizing plate or a retardation plate. Further, for example, a backlight may be provided on the substrate 150 side.

Alternatively, liquid crystal exhibiting a blue phase, which does not require an orientation film, may be used. A blue phase is one of the liquid crystal phases, which is exhibited just before a cholesteric phase changes into an isotropic phase when cholesteric liquid crystal is heated. Since the blue phase is exhibited within an only narrow range of temperature, a chiral agent at 5 wt % or more is mixed and used so as to improve the temperature range. A liquid crystal composition containing liquid crystal exhibiting a blue phase and a chiral agent has a response time of 10 µs to 100 µs. Further, such a liquid crystal composition is optically isotropic; therefore, orientation treatment is not necessary and viewing angle dependence is small.

Although FIG. 4B illustrates the example of a transmissive liquid crystal display panel, a reflective liquid crystal display panel and a semi-transmissive liquid crystal display panel are also applicable.

In FIGS. 3A to 3C and FIGS. 4A and 4B, a light-transmitting plastic substrate or the like can be used as the substrate 150 and the substrate 153. Here, as the plastic substrate, a fiberglass-reinforced plastics (FRP) plate, a polyvinyl fluoride (PVF) film, a polyester film, or an acrylic resin film can be used, for example. Alternatively, a sheet in which aluminum foil is interposed between PVF films or polyester films can be used.

Note that the thin film transistor 151 and the like are covered with a protective layer. Such a protective layer is provided in order to prevent entry of contamination impurities such as an organic matter, a metal matter, and water vapor floating in the atmospheric air; thus, such a protective layer is preferably a dense film. The protective layer may be formed using a single-layer film selected from a silicon oxide film, a silicon nitride film, a silicon oxynitride film, a silicon nitride oxide film, an aluminum oxide film, an aluminum nitride film, an aluminum oxynitride film, and an aluminum nitride oxide film, or a stacked-layer film including two or more layers of them, by a sputtering method, for example.

Over the above-described protective layer, an insulating layer serving as a planarization insulating film is provided. The insulating layer serving as a planarization insulating film can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, phospho-silicate-glass (PSG), boro-phospho-silicate-glass (BPSG), or the like. The insulating layer may be formed by stacking two or more layers of them.

There is no particular limitation on a method for forming the protective layer which covers the thin film transistor 151 and the like and a method for forming the insulating layer serving as a planarization insulating layer, and any of the following methods can be used depending on a material of the layers: a sputtering method, an SOG method, a spin coating method, a dipping method, a spray coating method, a droplet discharging method (an ink-jet method), a screen printing method, an offset printing method, and the like. In the case of forming these layers through a baking process, the baking process may also serve as annealing (200° C. to 400° C.) of a semiconductor layer included in the thin film transistor 151 and the like. When the process of baking the insulating layers also serves as the process of annealing the semiconductor layer, a display panel can be manufactured efficiently.

In the display panel, light emitted from a light source or a display element is transmitted, so that an image is displayed. Therefore, the substrate and the thin films such as an insulating film and a conductive film which are provided in a region of the display portion through which light is to be transmitted may have a light-transmitting property with respect to light in the visible-light wavelength range.

The first electrode layer 152 and the second electrode layer 154 for applying voltage to the display element may have a light-transmitting property or a reflecting property depending on a direction of light to be extracted, a place where the electrode layers are to be provided, and the pattern structure of the electrode layers. Note that the first electrode layer 152 and the second electrode layer 154 are referred to as a pixel electrode, a common electrode, a counter electrode, and the like depending on their functions.

The first electrode layer 152 and the second electrode layer 154 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added.

Further, a conductive composition including a conductive high molecule (also referred to as a conductive polymer) can be used for the first electrode layer 152 and the second electrode layer 154. As the conductive high molecule, a so-called π-electron conjugated conductive polymer can be used. For example, polyaniline or a derivative thereof, polypyrrole or a derivative thereof, polythiophene or a derivative thereof, and a copolymer of two or more kinds of those materials can be given.

In the case where the first electrode layer 152 and the second electrode layer 154 need not to have a light-transmitting property, the first electrode layer 152 and the second electrode layer 154 can be formed using one or more kinds selected from metal such as tungsten, molybdenum, zirconium, hafnium, vanadium, niobium, tantalum, chromium, cobalt, nickel, titanium, platinum, aluminum, copper, or silver; an alloy thereof; and a nitride thereof. As each of the first electrode layer 152 and the second electrode layer 154, a conductive layer can be formed thin (approximately several nanometers) using any of these materials so that the first electrode layer 152 and the second electrode layer 154 can have a light-transmitting property.

Since a thin film transistor is easily broken by static electricity or the like, a protection circuit is preferably provided. The protection circuit is preferably formed using a nonlinear element. The protection circuit may be provided between the display portion 157 and the driver circuit portion 158, for example.

In the above description, the thin film transistor included in the driver circuit portion 158 is formed through the same process as the thin film transistor 151 included in the display portion 157. However, the display panel which is an embodiment of the present invention is not limited thereto. Since the thin film transistor included in the driver circuit portion 158 is requested to operate at high speed, it is preferable that a single crystal semiconductor be formed over the substrate 150 and the single crystal semiconductor be processed and used for a driver circuit. Thus, a method for forming a single crystal semiconductor over the substrate 150 is described below. Note that in the description below, a first substrate 170 and a semiconductor substrate 190 are used (see FIGS. 5A-1, 5A-2, 5B-1, 5B-2, 5C-1, 5D, 5E, and 5F).

As the first substrate 170, any substrate is acceptable as long as it has heat resistance and chemical resistance enough to withstand a manufacturing process, and a material of the substrate is not limited to a particular material. For example, a glass substrate, a quartz substrate, a silicon substrate, a stainless steel substrate, or the like, or any of these substrates over which an insulating layer is provided can be used. Here, a glass substrate is used. Since the glass substrate having a large area can be manufactured, productivity can be improved. Further, a technique of manufacturing a semiconductor element (for example, a thin film transistor) over a glass substrate has almost been established, and a process with high versatility can be employed by using the glass substrate.

As a material for the semiconductor substrate 190, silicon or germanium is used for example. Alternatively, a compound semiconductor such as gallium arsenide or indium phosphide may be used. Note that the semiconductor substrate 190 is not limited to a single crystal semiconductor substrate, and may be a polycrystalline semiconductor substrate, for example. Here, as the most preferred mode, the case of using a single crystal silicon substrate is described. With the use of a single crystal substrate as a semiconductor substrate, a semiconductor device capable of high speed operation can be manufactured. Furthermore, with the use of a silicon substrate, a process with high versatility can be employed. Therefore, with the use of a single crystal silicon substrate, a semiconductor device capable of high speed operation can be manufactured through a process with high versatility.

Figures 1, 5A:
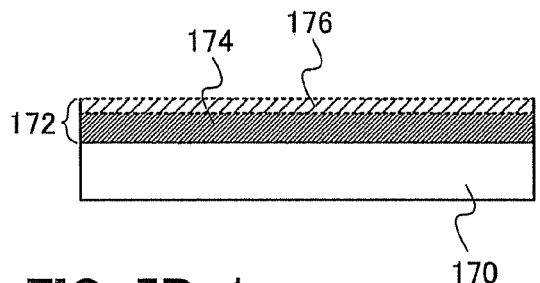

First, a separation layer 172 is formed over the first substrate 170 (see FIG. 5A-1). The separation layer 172 may be a single layer or stacked layers of a plurality of layers. In FIG. 5A-1, the separation layer 172 has a stacked-layer structure in which a second separation layer 176 is formed over a first separation layer 174.

The separation layer 172 is formed in such a manner that a layer formed using an element selected from tungsten, molybdenum, titanium, tantalum, niobium, nickel, cobalt, zirconium, zinc, ruthenium, rhodium, palladium, osmium, iridium, or silicon; an alloy material containing any of the elements described above as its main component; or a compound material containing any of the elements described above as its main component, is formed by a sputtering method, for example, to have a single layer or stacked layers. Here, the crystal structure of the materials listed above is not limited in particular. Further, as well as a sputtering method, a plasma CVD method, a coating method (a spin coating method), a droplet discharging method, a dispensing method, or a printing method may be used.

When the separation layer 172 has a single layer structure, the separation layer 172 is preferably formed using tungsten, molybdenum, or a mixture of tungsten and molybdenum, or formed using a material containing any of these. Alternatively, the separation layer 172 is formed using a material containing oxide or oxynitride of tungsten; a material containing oxide or oxynitride of molybdenum; or a material containing oxide or oxynitride of a mixture of tungsten and molybdenum. Note that the mixture of tungsten and molybdenum is an alloy material of tungsten and molybdenum, for example.

When the separation layer 172 has a stacked-layer structure, the separation layer 172 is preferably formed using a metal layer as a first layer (first separation layer 174) and a metal oxide layer as a second layer (second separation layer 176). For example, it is preferable that a layer including tungsten, molybdenum, or a mixture of tungsten and molybdenum be formed as the first separation layer 174, and a layer including oxide, oxynitride, nitride, or nitride oxide of tungsten; oxide, oxynitride, nitride, or nitride oxide of molybdenum; or a material including oxide, oxynitride, nitride, or nitride oxide of a mixture of tungsten and molybdenum be formed as the second separation layer 176.

In the case where a metal layer as the first separation layer 174 and a metal oxide layer as the second separation layer 176 are stacked, for example, a layer including tungsten is formed as the first separation layer 174, and an insulating layer formed using metal oxide is formed thereover, whereby a layer including oxide of tungsten is formed at the interface between the layer including tungsten and the insulating layer formed using metal oxide. The layer including oxide of tungsten may be used as the second separation layer 176. Further, a metal oxide layer as the second separation layer 176 may be formed by performance of thermal oxidation treatment, oxygen plasma treatment, treatment with a solution having strong oxidizing power such as ozone water, or the like to the surface of the metal layer as the first separation layer 174. For example, a silicon oxide layer may be formed over a tungsten layer, whereby a tungsten oxide layer may be formed between the tungsten layer and the silicon oxide layer. However, since the oxide of tungsten and the silicon oxide do not easily adhere to each other, there is a possibility that the oxide of tungsten and the silicon oxide may be separated from each other in a manufacturing process without intention, although it is advantageous in terms of separation. On the other hand, when a tungsten nitride layer is formed between the tungsten layer and the silicon oxide layer, there is a problem in that it is difficult to perform separation, although separation without intention in a manufacturing process can be prevented. Thus, a layer to be provided as the separation layer 172 may be selected in accordance with a manufacturing process. For example, a stacked-layer structure in which a tungsten oxynitride layer is provided between a silicon oxide layer and a tungsten nitride layer may be used.

Note that the above-described plasma treatment or heat treatment may be performed in an atmosphere of dinitrogen monoxide, nitrogen dioxide, or a mixed gas including any of these gases and another gas.

Further, a metal nitride layer or a metal oxynitride layer may be provided as the second separation layer 176. For example, a layer including tungsten may be formed as the first separation layer 174, and a tungsten nitride layer or a tungsten oxynitride layer may be formed as the second separation layer 176.

The separation layer 172 may be formed to have a thickness with which an element is not damaged in a separation process and throughput is not reduced to excess. For example, a tungsten layer with a thickness of 30 nm may be formed as the first separation layer 174, and a silicon oxide layer with a thickness of 250 nm may be formed as the second separation layer 176. The first separation layer 174 and the second separation layer 176 can be formed by a sputtering method, a CVD method, or the like, for example.

It is to be noted that when the tungsten layer is formed as the first separation layer 174 and the silicon oxide layer is formed as the second separation layer 176 by a CVD method, dinitrogen monoxide plasma treatment is preferably performed just after the tungsten layer as the first separation layer 174 is formed. By performing dinitrogen monoxide plasma treatment, the tungsten oxide layer can be formed thick. With a thick tungsten oxide layer which is formed at the interface between the tungsten layer and the silicon oxide layer, adherence required in a manufacturing process can be secured and the separation can be performed smoothly.

Then, a surface of the separation layer 172 is planarized. The surface of the separation layer 172 is uneven in many cases, and this is particularly remarkable when the separation layer 172 is a layer formed by a sputtering method. When the surface is uneven, an area where bonding layers are in contact with each other is reduced in bonding the bonding layers provided on two substrates in a later process; thus, enough bonding strength cannot be ensured. Therefore, it is preferable that the separation layer 172 be planarized.

Note that planarity which is desired here may be greater than or equal to a degree such that the first substrate and the semiconductor substrate can be bonded to each other. Note that here, planarity is expressed using average surface roughness $R_a$ and root-mean-square surface roughness $R_{ms}$, which is defined as follows.

Here, a measurement surface whose planarity is measured is to be a rectangular region within four points represented by the coordinates (x1, y1), (x1, y2), (x2, y1), and (x2, y2), and this area is referred to as $S_0$. When the measurement surface is represented by S, and roughness at the measurement surface is represented by a function f(x), average surface roughness $R_a$ is defined by formula (1) below.

$$R_a = \frac{1}{S_0} \int\int_S |f(S) - Z_0| dS \qquad \text{[FORMULA 1]}$$

Note that $Z_0$ is an average height of the measurement surface and represented by formula (2) below.

$$Z_0 = \frac{1}{S_0} \int_{y1}^{y2} \int_{x1}^{x2} f(x, y) \, dx \, dy \qquad \text{[FORMULA 2]}$$

Note that when the coordinates (x1, y1), (x1, y2), (x2, y1), and (x2, y2) are used, formula (1) can be defined as formula (3) below.

$$R_a = \frac{1}{S_0} \int_{y1}^{y2} \int_{x1}^{x2} |f(x, y) - Z_0| \, dx \, dy \qquad \text{[FORMULA 3]}$$

The root-mean-square surface roughness $R_{ms}$ can be defined as formula (4) below.

$$R_{ms} = \sqrt{\frac{1}{S_0} \int_{y1}^{y2} \int_{x1}^{x2} \{f(x, y) - Z_0\}^2 \, dx} \qquad \text{[FORMULA 4]}$$

The separation layer 172 may be planarized by a method by which an entire surface of the separation layer 172 can be uniformly planarized. Further, the separation layer 172 is preferably planarized through a simple process which can be performed in the same apparatus as the process of forming the separation layer or the process of forming the bonding layer. As such a method, for example, a reverse sputtering method is given. However, the method is not limited to this, and any treatment method can be used as long as planarity can be increased. These treatment methods may be physical etching methods or chemical etching methods.

When the separation layer is formed by a sputtering method, planarization is performed by a reverse sputtering method. Accordingly, processes from formation of the separation layer to planarization can be performed in the same apparatus, and throughput is improved, which is preferable.

A reverse sputtering method is performed by, for example, introducing an inert gas (an argon gas or the like) to a high vacuum chamber and generating plasma by applying an electric field to a surface to be processed. In plasma, positive ions generated using an inert gas or the like and electrons are present. The positive ions generated using an inert gas or the like are accelerated in a cathode direction. The surface to be processed is sputtered with the accelerated positive ions. At this time, a convex portion of the surface to be processed is preferentially sputtered and planarized.

Figures 1, 5B:
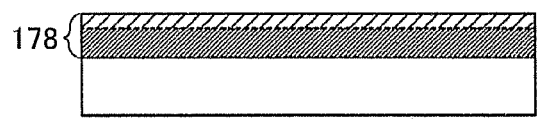

As described above, planarity of the separation layer 172 is improved, so that a planarized separation layer 178 can be formed (see FIG. 5B-1). Furthermore, the separation layer can be formed and planarized successively and collectively in the same apparatus. Thus, throughput in a manufacturing process of a semiconductor device is improved, which is preferable.

Figures 1, 5C:
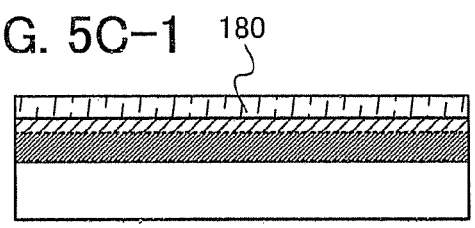

Subsequently, a first bonding layer 180 is formed over the planarized separation layer 178 (see FIG. 5C-1). Since the first bonding layer 180 is formed by a sputtering method, a CVD method, or the like, the surface of the first bonding layer 180 is influenced by the shape of the planarized separation layer 178. The first bonding layer 180 is formed using a material with which the surface of the first bonding layer 180 has high planarity and hydrophilicity. A silicon oxide layer may be used for the first bonding layer 180, for example. In particular, a silicon oxide layer formed by a chemical vapor deposition method using a silane-based gas such as a silane gas, a disilane gas, a trisilane gas, or an organosilane gas, is preferable. Alternatively, a silicon oxynitride layer is preferably formed using a mixed gas including a nitrogen dioxide or dinitrogen monoxide. As an organosilane gas, the following silicon-containing compound can be used: triethyl borate (also referred to as TEOS); trimethylsilane (TMS); tetramethylcyclotetrasiloxane (TMCTS); octamethylcyclotetrasiloxane (OMCTS); hexamethyldisilazane (HMDS); triethoxysilane (chemical formula: $SiH(OC_2H_5)_3$); trisdimethylaminosilane (chemical formula: $SiH(N(CH_3)_2)_3$); or the like. As a chemical vapor deposition method, a plasma CVD method, a thermal CVD method, or a photo CVD method may be used. Still alternatively, as the first bonding layer 180, a silicon nitride layer, stacked layers in which a silicon nitride oxide layer is stacked over a silicon nitride layer, or stacked layers in which a silicon oxynitride layer is stacked over a silicon nitride layer may be used. Still further alternatively, an aluminum oxide layer may be used.

Note that hydrophilicity is defined by a contact angle of water on a solid surface. Here, the contact angle is an angle θ made by the solid surface and a tangent line of a liquid drop at the edge of dropped dots. In the case where the contact angle when water is dropped to the solid surface is 0° or more and less than 90°, the solid surface has hydrophilicity, and in the case where the contact angle when water is dropped to a solid surface is 90° or more and 180° or less, the solid surface has water repellency.

The first bonding layer 180, the surface of which has high planarity and hydrophilicity, may be provided at a thickness of from 5 nm to 500 nm. With the use of the first bonding layer 180 provided at such a thickness, a bonding surface can be made less likely to be affected by the shape of a base even when the first bonding layer 180 is an insulating layer which is formed such that its surface is influenced by the shape of the base (for example, a silicon oxide layer formed by a CVD method). In addition, by forming the first bonding layer 180 with a large thickness of from 400 nm to 500 nm, distortion caused between substrates which are to be bonded can be relieved.

The planarized separation layer 178 provided in contact with a bottom of the first bonding layer 180 is a layer planarized by a reverse sputtering method or the like. Therefore, the first bonding layer 180 may be formed thin. Specifically, the first bonding layer 180 can be formed to a thickness of from 5 nm to 50 nm. Since the first bonding layer 180 can be formed thin, throughput in a manufacturing process of a semiconductor device can be improved. However, the first bonding layer 180 may be formed to a thickness greater than 50 nm.

With the planarized separation layer 178 provided in contact with the bottom of the first bonding layer 180, regardless of the thickness of the first bonding layer 180, separation between the bonding layers can be made hard to occur, and yield in a manufacturing process is improved. Furthermore, separation between the bonding layers is hard to occur, and a defect due to separation therebetween can be reduced. As a result, a highly reliable semiconductor device can be manufactured.

A semiconductor substrate 190 is also processed while a thin film is formed over the first substrate 170 as described above.

Figures 2, 5A:
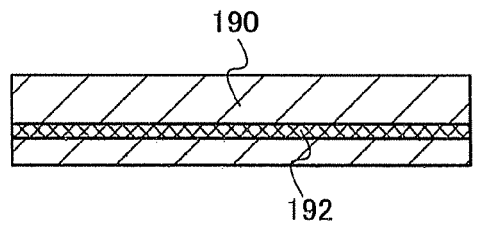
Figures 2, 5B:
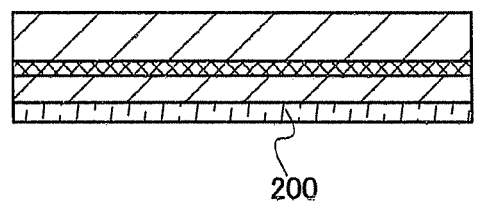

A damaged area 192 is formed in a certain depth from a surface of the semiconductor substrate 190 (see FIG. 5A-2). The damaged area 192 is formed by introducing ions accelerated by an electric field from a cleaned surface of the semiconductor substrate 190 to a predetermined depth. The ions are introduced in consideration of a thickness of a single crystal semiconductor layer or a polycrystalline semiconductor layer (hereinafter referred to as a LTSS layer) formed over the first substrate 170 while adjusting an accelerating voltage or the like. A thickness of the LTSS layer is set to be from 5 nm to 500 nm, preferably 10 nm to 200 nm. The damaged area 192 can be formed using hydrogen, an inert gas, or halogen. As an inert gas, helium is used for example, and as halogen, fluorine is used for example.

Since the ions are introduced at a high dose in the formation of the damaged area 192, the surface of the semiconductor substrate 190 is roughened in some cases. In order to prevent the surface roughness, a protective layer may be provided on a surface to which ions are introduced. This protective layer may be formed using silicon oxide, silicon nitride, silicon nitride oxide, or the like with a thickness of from 0.5 nm to 200 nm.

The condition of the dose is set as appropriate depending on the purpose. In accordance with the condition of the dose, a depth from the surface of the semiconductor substrate at which the damaged area 192 is formed is determined. For example, when accelerating voltage is set to 60 kV, and the dose is set to $2.0 \times 10^{16}$ cm$^{-2}$, the damaged area 192 is formed in a position at a depth of about 150 nm from the surface of the semiconductor substrate.

Then, a second bonding layer 200 is formed over a surface which forms a bond with the first substrate 170 (see FIG. 5B-2). The second bonding layer 200 is preferably formed using an insulating layer including silicon, specially, a silicon oxide layer. As the silicon oxide layer, a silicon oxide layer formed by a chemical vapor deposition method using an organosilane gas as described above is preferably used. A chemical vapor deposition method is formed at a temperature such that degassing of the damaged area 192 formed in the semiconductor substrate 190 does not occur (for example, at 350° C. or lower). Note that the heat treatment for separating the LTSS layer from a single crystal semiconductor substrate or a polycrystalline semiconductor substrate may be carried out at a temperature higher than the temperature for forming the second bonding layer 200.

As a chemical vapor deposition method, a plasma CVD method, a thermal CVD method, or a photo CVD may be used. In particular, by a plasma CVD method using tetraethoxysilane and $O_2$, or a thermal CVD method using monosilane and nitrogen dioxide, a planarized silicon oxide layer which is suitable for a bonding layer can be formed at a low temperature (350° C. or lower), which is preferable.

Alternatively, a silicon oxide layer to be the second bonding layer 200 can be formed using a chemical solution including ozone water and hydrogen peroxide or using ozone water. In that case, the thickness of the silicon oxide layer may be from 0.5 nm to 5 nm. Alternatively, the second bonding layer 200 may be a surface of a semiconductor in which dangling bonds are terminated by hydrogen or fluorine. Further alternatively, the silicon oxide layer to be the second bonding layer 200 can be formed using a chemical solution including hydrogen chloride (for example, dichloroethylene).

Note that if the bonding strength between the first bonding layer 180 and the semiconductor substrate 190 is sufficient, the second bonding layer 200 is not necessarily formed, and the first bonding layer 180 and the semiconductor substrate 190 may be directly bonded together.

Similarly, if the bonding strength between the planarized separation layer 178 and the second bonding layer 200 is sufficient, the first bonding layer 180 is not necessarily formed, and the planarized separation layer 178 and the second bonding layer 200 may be directly bonded.

That is, in the case where there is no problem in bonding strength, a bonding layer is not necessarily formed on each of the first substrate 170 and the semiconductor substrate 190. By not forming the bonding layer, throughput in a manufacturing process of a semiconductor device can be improved. Further, since a material used in a manufacturing process can be reduced, the cost for performing a manufacturing process can be reduced. Such a mode will be described later.

Figure 5D:
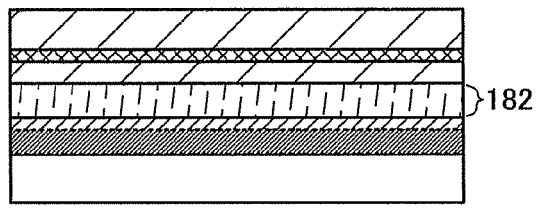

Subsequently, the first bonding layer 180 formed over the first substrate 170 and the second bonding layer 200 formed over the semiconductor substrate 190 are disposed in close contact with and bonded to each other, whereby a third bonding layer 182 is formed (see FIG. 5D). By disposing the first bonding layer 180 and the second bonding layer 200 in close contact with each other, they can be bonded at a room temperature. In order to form a stronger bond, pressure may be applied in a direction perpendicular to the bonding surfaces of the first substrate 170 and the semiconductor substrate 190. Further, heat treatment may be performed on the first substrate 170 and the semiconductor substrate 190. The heat treatment may be performed while pressure is applied. By the heat treatment which is performed while pressure is applied, the first bonding layer 180 and the second bonding layer 200 can be bonded more firmly. Thus, unintended separation between the bonding layers can be prevented and yield is improved. Further, the reliability of a semiconductor device to be obtained is increased.

To bond the surfaces to be bonded, which are formed from different kinds of materials, to each other at low temperature, the surface is preferably cleaned. When the first bonding layer 180 and the second bonding layer 200, the surfaces of which are cleaned, are disposed in close contact with each other, the third bonding layer 182 is formed by attractive force between the surfaces. In order to make the cleaned surfaces to be hydrophilic surfaces, a plurality of hydroxyl groups may be attached. For example, oxygen plasma treatment or ozone treatment may be performed on the surface of the first bonding layer 180 and the second bonding layer 200. By adding the treatment by which the surface is made hydrophilic in this manner, hydrogen bonding is formed with the use of the hydroxyl groups on the surface; thus, a strong bond is formed.

Further, in order to form a strong bond, a surface to be bonded may be activated. For example, the surface to be bonded is irradiated with an atomic beam or an ion beam, whereby the surface can be activated. In the case where an atomic beam or an ion beam is used, an inert gas neutral atomic beam or an inert gas ion beam of argon or the like can be used. Specially, by the irradiation with an ion beam, a dangling bond is exposed on a surface of the first bonding layer 180 or the second bonding layer 200 and extremely active surfaces are formed. Alternatively, plasma irradiation or radical treatment may be performed on the surface to be bonded. By performing such surface treatment on the surface to be bonded, even if the first bonding layer 180 and the second bonding layer 200 are formed from different kinds of materials, the third bonding layer 182 can be easily formed at a temperature approximately from 200° C. to 400° C. In the method of activating the surface for bonding, since it is required to keep the surface in a highly cleaned state, the method is preferably carried out in vacuum, still preferably, in high vacuum.

In order to enhance the bonding strength of the third bonding layer 182, heat treatment or pressure treatment is preferably performed after the bonding. Specially, when the third bonding layer 182 is bonded at a room temperature, heat treatment is preferably performed after the bonding is performed. By performing the heat treatment or pressure treatment, a main bond which contributes to bonding at the bonding surfaces is changed from a hydrogen bond into a covalent bond, and the bonding strength is further improved. The heat treatment is performed at a temperature lower than or equal to the upper temperature limit of the first substrate 170. In the pressure treatment, pressure is applied in a direction perpendicular to the bonding surfaces. The pressure to be applied is determined in consideration of mechanical strength of the first substrate 170 and the semiconductor substrate 190, or the like.

Figure 5E:
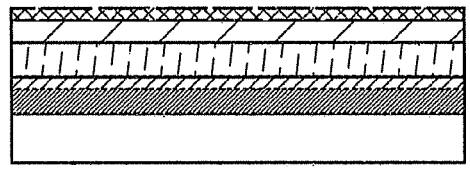

Then, heat treatment is performed on the first substrate 170 to which the semiconductor substrate 190 is bonded, and the semiconductor substrate 190 is separated from the first substrate 170 using a given position in the damaged area 192 as a cleavage plane (see FIG. 5E). Here, a physical means may be used for the separation. Note that heat treatment is preferably performed at higher than or equal to the film formation temperature of the first bonding layer 180 and the second bonding layer 200, and lower than or equal to the upper temperature limit of the first substrate 170. For example, heat treatment is preferably performed at a temperature of 400° C. to 600° C. With the heat treatment within such a temperature range, the volume of minute voids formed in the damaged area 192 is changed, whereby cleavage along the damaged area 192 can be performed. Because the third bonding layer 182 is bonded to the first substrate 170, the LTSS layer having the same or substantially the same crystallinity as the semiconductor substrate 190 is left over the first substrate 170.

Note that the physical means in this case refers to a dynamic means or a mechanical means, which changes some sort of dynamic energy (mechanical energy). The physical means is, for example, an action of applying mechanical force (e.g., a peeling process with a human hand or with a gripper, or a separation process by rotating a roller).

Figure 5F:
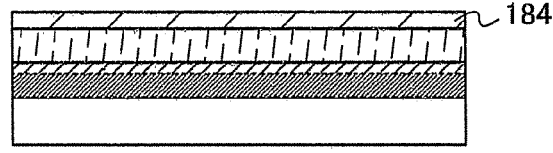
Figures 1, 6A:
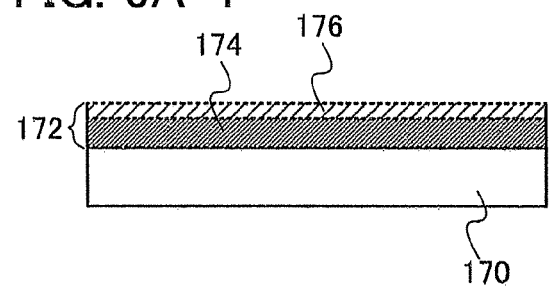
Figures 2, 6A:
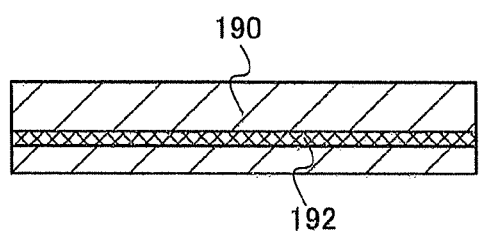
Figures 1, 6B:
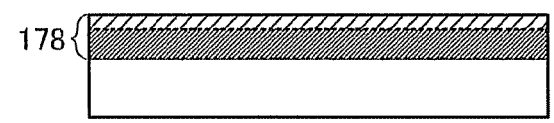
Figures 2, 6B:
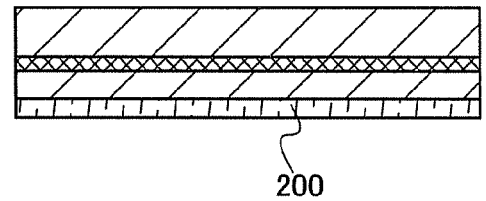
Figure 6C:
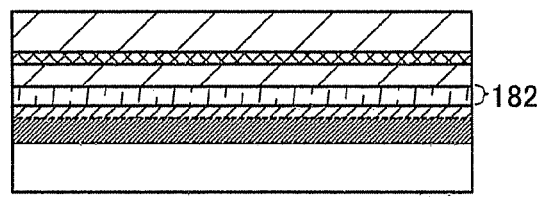
Figure 6D:
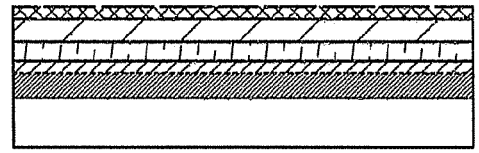
Figure 6E:
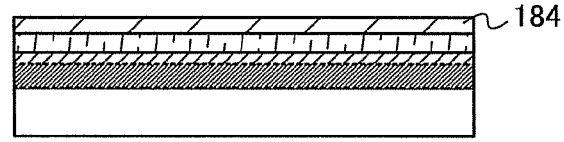
Figures 1, 7A:
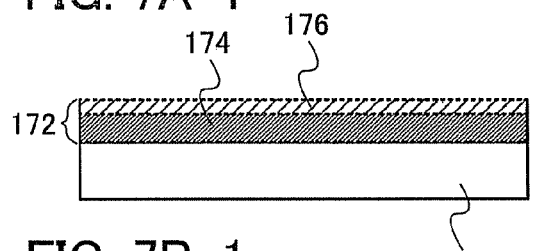
Figures 1, 7B:
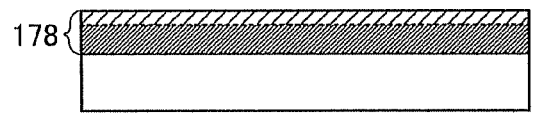
Figures 2, 7A:
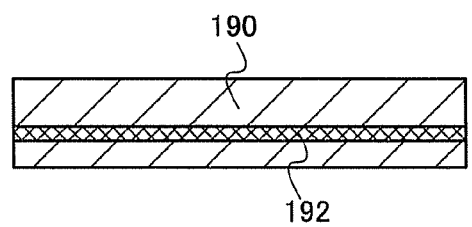
Figures 1, 7C:
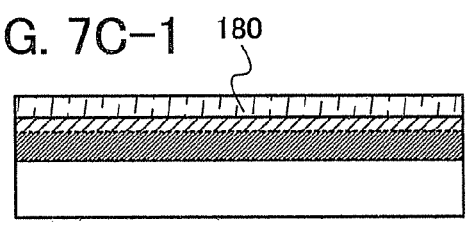
Figure 7D:
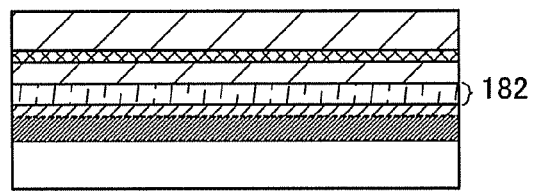
Figure 7E:
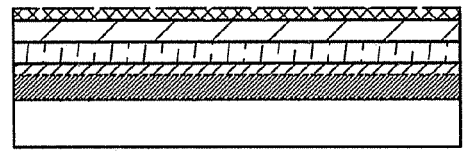
Figure 7F:
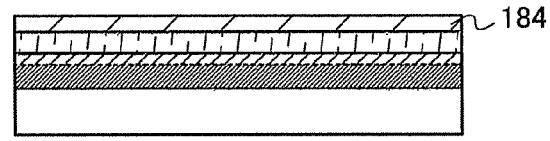
Figures 2, 9A:
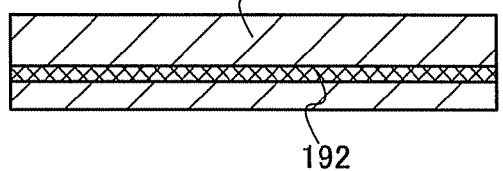
Figures 1, 9A:
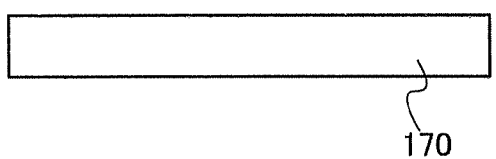
Figures 2, 9B:
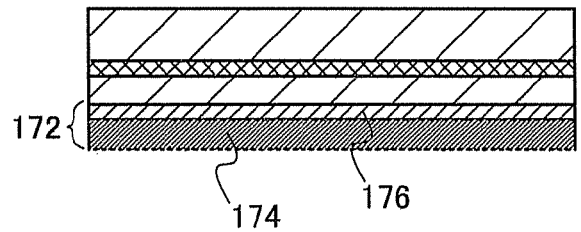
Figures 2, 9C:
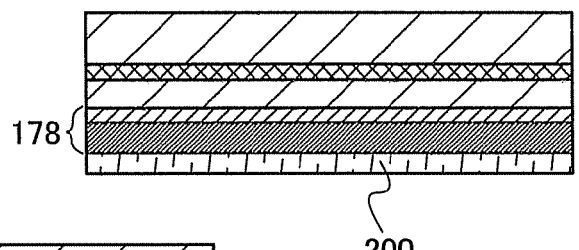
Figure 9D:
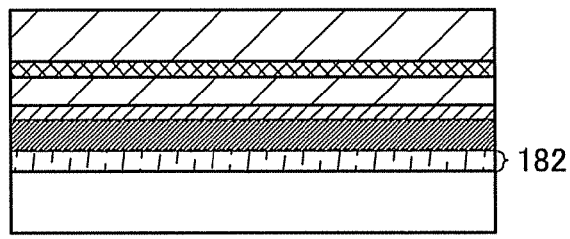
Figure 9E:
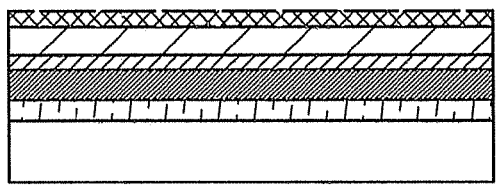
Figure 9F:
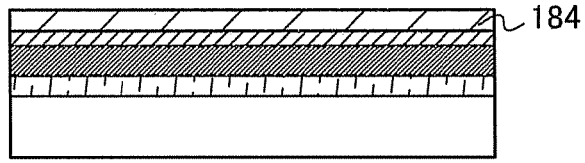

An LTSS layer 184 is preferably thinned and planarized by chemical mechanical polishing (CMP) or the like after the above separation process (see FIG. 5F). For example, the LTSS layer 184 can be formed by an ion implantation separation method, by which hydrogen, an inert gas typified by helium, or halogen typified by fluorine is introduced into a predetermined depth of the single crystal semiconductor substrate; heat treatment is performed; and a single crystal silicon layer which is a surface layer is separated. Alternatively, a method may be used by which after single crystal silicon is epitaxially grown over porous silicon, a porous silicon layer is cleaved by water-jetting to perform separation. The thickness of the LTSS layer 184 is set at from 5 nm to 500 nm, preferably, from 10 nm to 200 nm. Note that the present invention is not limited to this, and the LTSS layer may be thinned and planarized by a reverse sputtering method, or by both a CMP method and a reverse sputtering method.

Before the semiconductor substrate 190 is separated using the damaged area 192 as a cleavage plane, a trigger may be made so that separation can be performed easily. Moreover, at the time of separating the semiconductor substrate 190, if an adhesive sheet which can be separated by light or heat is provided on at least one of the surfaces of the first substrate 170 or the semiconductor substrate 190, one of the first substrate 170 and the semiconductor substrate 190 is fixed, and the other is separated, separation can be performed more easily. Here, by providing a supporting member on the other surface of the first substrate 170 or the semiconductor substrate 190 (on at least one surface where a bond is not formed), separation can be easily performed.

Although not shown, a barrier layer may be provided between the LTSS layer 184 and the third bonding layer 182. The barrier layer may be provided using a material which can prevent the LTSS layer 184 from being contaminated by an impurity to be a mobile ion like alkali metal or alkaline earth metal that is diffused from a glass substrate used as the first substrate 170. It is preferable that the barrier layer can prevent diffusion of an impurity from the separation layer. As the barrier layer, for example, an insulating layer including nitrogen can be used. As the insulating layer including nitrogen, a single layer or stacked layers of any of a silicon nitride layer, a silicon nitride oxide layer, or a silicon oxynitride layer can be used. For example, by stacking a silicon oxynitride layer and a silicon nitride oxide layer from the LTSS layer 184 side, the barrier layer formed using the insulating layer including nitrogen can be provided.

Note that silicon oxynitride refers to a substance that contains more oxygen than nitrogen and, in the case where measurements are performed using Rutherford backscattering spectrometry (RBS) and hydrogen forward scattering (RFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide refers to a substance having higher composition of nitrogen than oxygen, and showing the concentration ranges of oxygen, nitrogen, silicon, and hydrogen from 5 to 30 at. %, 20 to 55 at. %, 25 to 35 at. %, and 10 to 30 at. %, respectively in the measurement using RBS and HFS. Note that percentages of nitrogen, oxygen, silicon, and hydrogen fall within the ranges given above, where the total number of atoms contained in the silicon oxynitride film or the silicon nitride oxide film is defined as 100 at. %.

Note that the present invention is not limited to the above description, and the first bonding layer 180 is not necessarily formed in the case where the first bonding layer 180 is not necessary (see FIGS. 6A-1, 6A-2, 6B-1, 6B-2, 6C, 6D, and 6E). Alternatively, the second bonding layer 200 is not necessarily formed in the case where the second bonding layer 200 is not necessary (see FIGS. 7A-1, 7A-2, 7B-1, 7C-1, 7D, 7E, and 7F). Note that the phrase "the case where the bonding layer is not necessary" means a case where a bonding surface and a surface to be bonded are sufficiently and firmly bonded together without the bonding layer. When only one of the first bonding layer 180 and the second bonding layer 200 is formed, or the first bonding layer 180 and the second bonding layer 200 are not formed, the number of processes is reduced and throughput is improved.

The present invention is not limited to the above description, and for example, the separation layer may be formed over the semiconductor substrate. Such a mode will be described below. Note that a repeated explanation will be omitted.

FIGS. 8A-1, 8A-2, 8B-2, 8C-2, 8D, 8E, and 8F illustrate an example of a mode for forming a separation layer on the semiconductor substrate side.

First, in a manner similar to the above description, ions are introduced into the semiconductor substrate 190, whereby the damaged area 192 is formed (see FIG. 8A-2).

Then, in a similar manner to the above description, the separation layer 172 is formed over the semiconductor substrate 190 where the damaged area 192 is formed (see FIG. 8B-2).

Then, the separation layer 172 is planarized, and the second bonding layer 200 is formed over the planarized separation layer 178. Note that the separation layer 172 is preferably planarized by a reverse sputtering method (see FIG. 8C-2).

The first bonding layer 180 is formed over the first substrate 170 in a manner similar to the above description, while the semiconductor substrate 190 is processed (see FIG. 8A-1).

The thus processed first substrate 170 is bonded to the semiconductor substrate 190. That is, in a manner similar to the above description, the first bonding layer 180 and the second bonding layer 200 are bonded, whereby the third bonding layer 182 can be formed (see FIG. 8D).

Subsequently, the semiconductor substrate 190 is separated at the damaged area 192, whereby a semiconductor layer is formed over the first substrate 170 (see FIG. 8E). Further, the semiconductor layer is planarized, whereby the LTSS layer 184 is formed (see FIG. 8F).

Note that also here, the present invention is not limited to the above description, and the first bonding layer 180 is not necessarily formed in the case where the first bonding layer 180 is not necessary (see FIGS. 9A-1, 9A-2, 9B-2, 9C-2, 9D, 9E, and 9F). Alternatively, the second bonding layer 200 is not necessarily formed in the case where the second bonding layer 200 is not necessary (see FIGS. 10A-1, 10A-2, 10B-2, 10C-2, 10D, 10E and 10F). Note that the phrase "the case where the bonding layer is not necessary" means a case where a bonding surface and a surface to be bonded are sufficiently and firmly bonded together without forming the bonding layer. When only one of the first bonding layer 180 and the second bonding layer 200 is formed, or the first bonding layer 180 and the second bonding layer 200 are not formed, the number of processes is reduced and throughput is improved.

As described above, a substrate provided with a single crystal semiconductor (an LTSS layer) can be manufactured. An element such as a thin film transistor can be formed over a substrate which is manufactured as described above. Further, a display device can be manufactured using the thin film transistor. A method for manufacturing such a display device is described below. Note that in the description below, as a preferred mode, a mode is described in which an LTSS layer formed as described above is used for only a driver circuit portion. However, the present invention is not limited to this, and a thin film transistor in a pixel portion may be formed using an LTSS layer.

Figure 11A:
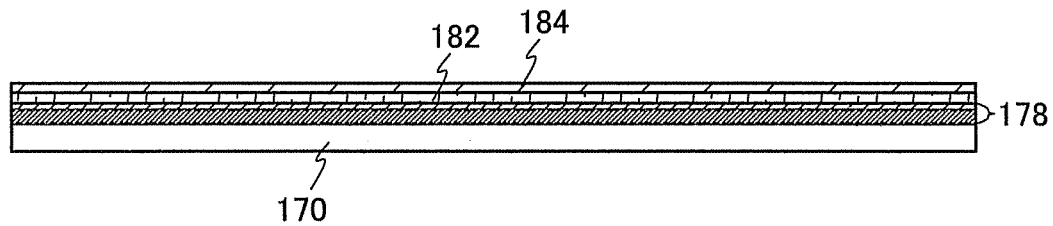
FIGS. 11A to 11E illustrate a method for manufacturing a display panel which is an embodiment of the present invention.

Here, the first substrate 170 having the LTSS layer 184, which is manufactured as described above, is used (see FIG. 11A). The planarized separation layer 178 is provided over the first substrate 170, and the third bonding layer 182 is provided over the planarized separation layer 178. The LTSS layer 184 is provided over the third bonding layer 182.

The first substrate 170 may be selected as appropriate in a manner that depends on the manufacturing process of the element. For example, a glass substrate, a quartz substrate, a sapphire substrate, a ceramic substrate, or a metal substrate having an insulating layer on its surface can be used as the first substrate 170. Moreover, a plastic substrate which can withstand process temperature may also be used.

Figure 11B:
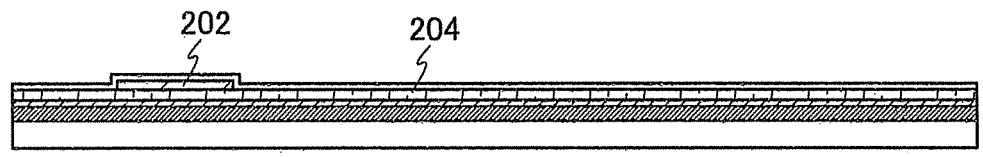

The LTSS layer 184 over the first substrate 170 is processed into a desired pattern shape (see FIG. 11B). Here, for the processing of the LTSS layer 184, etching may be performed using a resist mask. A semiconductor layer 202 is formed in this manner. Then, a gate insulating film 204 covering the semiconductor layer 202 is formed.

Figure 11C:
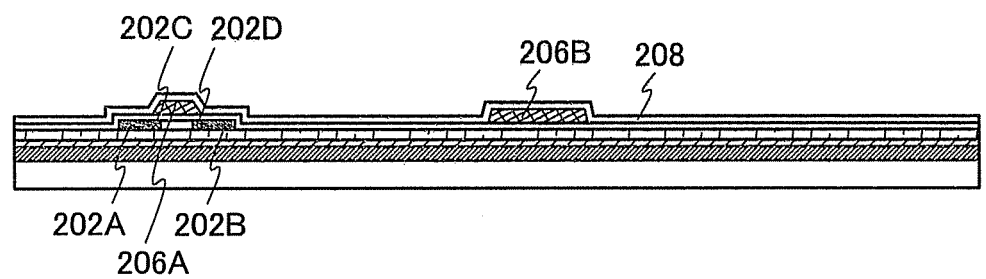

Next, a conductive layer 206A and a conductive layer 206B are formed over the insulating film 204. The conductive layer 206A is formed over the semiconductor layer 202, and the conductive layer 206B is formed in a pixel portion. The conductive layer 206A and the conductive layer 206B may be formed in such a manner that a conductive film is formed and etched to have a desired pattern shape. The conductive layer 206A and the conductive layer 206B (particularly the conductive layer 206A) preferably have a tapered shape. In the state where the conductive layer 206A and the conductive layer 206B are formed, an impurity element imparting one conductivity type is added to the semiconductor layer 202. With the conductive layer 206A having a tapered shape as described above, a low concentration impurity region 202C and a low concentration impurity region 202D can be formed in the semiconductor layer 202 overlapping with a tapered portion (a relatively thin portion) in the edge portion of the conductive layer 206A. Here, in regions of the semiconductor layer 202 not overlapping with the conductive layer 206A, a high concentration impurity region 202A and a high concentration impurity region 202B are formed. Then, an insulating film 208 covering the conductive layer 206A and the conductive layer 206B is formed (see FIG. 11C).

Figure 11D:
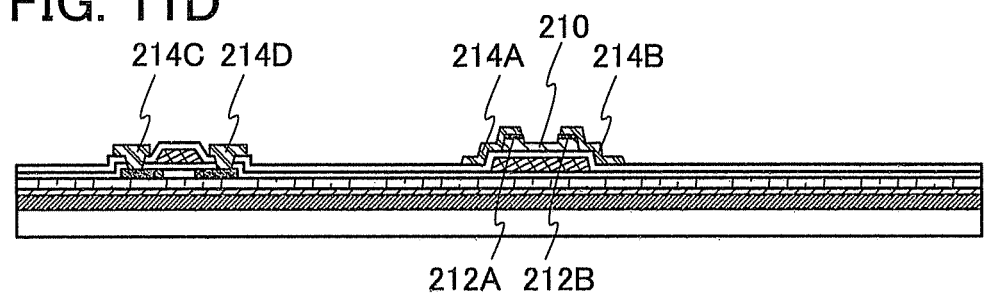

Next, a semiconductor layer 210 is formed over the insulating film 208 overlapping with the conductive layer 206B, and an impurity semiconductor layer is formed over the semiconductor layer 210. The semiconductor layer 210 and the impurity semiconductor layer may be formed as follows: a semiconductor film is formed over the insulating film 208; an impurity semiconductor film is formed over the semiconductor film; and then, the semiconductor film and the impurity semiconductor film are etched to have an island like shape. Then, a conductive film covering the semiconductor layer 210 and the impurity semiconductor layer is formed, and the conductive film is etched to have a desired pattern shape, whereby a conductive layer 214A and a conductive layer 214B are formed. The impurity semiconductor layer is etched in a state where the conductive layer 214A and the conductive layer 214B are formed, whereby an impurity semiconductor layer 212A and an impurity semiconductor layer 212B are formed. Note that in this process, a conductive layer 214C and a conductive layer 214D which are to be connected to the high concentration impurity region 202A and the high concentration impurity region 202B are also formed; thus, opening portions may be formed in desired portions of the insulating film 208 (portions overlapping with the high concentration impurity region 202A and the high concentration impurity region 202B) (see FIG. 11D). Note that the impurity semiconductor layer 212A and the impurity semiconductor layer 212B are not necessarily provided in the case where the impurity semiconductor layer 212A and the impurity semiconductor layer 212B are not necessary.

Figure 11E:
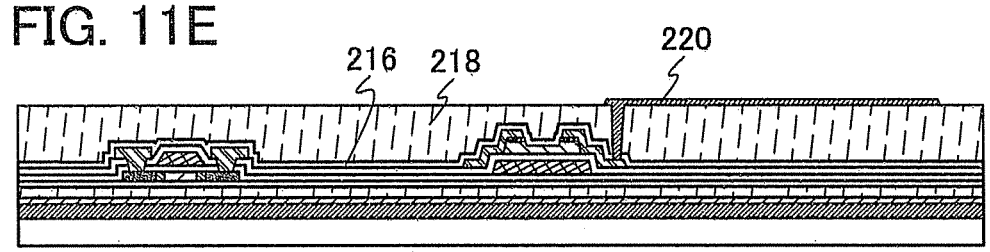

Next, an insulating film 216 and an insulating film 218 covering these components are formed. Then, an opening portion is formed in a desired portion of the insulating film 216 and the insulating film 218, and a conductive layer 220 is formed to be connected to the conductive layer 214A or the conductive layer 214B through the opening portion. As the conductive layer 220, a conductive film may be formed and etched to have a desired shape (see FIG. 11E).

Figure 12A:
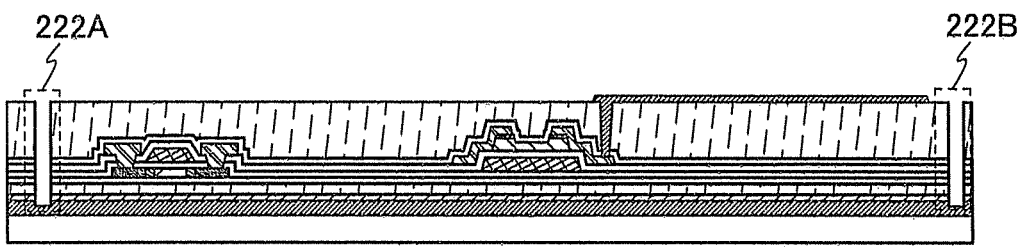
FIGS. 12A to 12E illustrate the method for manufacturing the display panel which is the embodiment of the present invention.

Next, an opening portion 222A and an opening portion 222B are formed so as to reach the planarized separation layer 178 (see FIG. 12A).

Figure 12B:
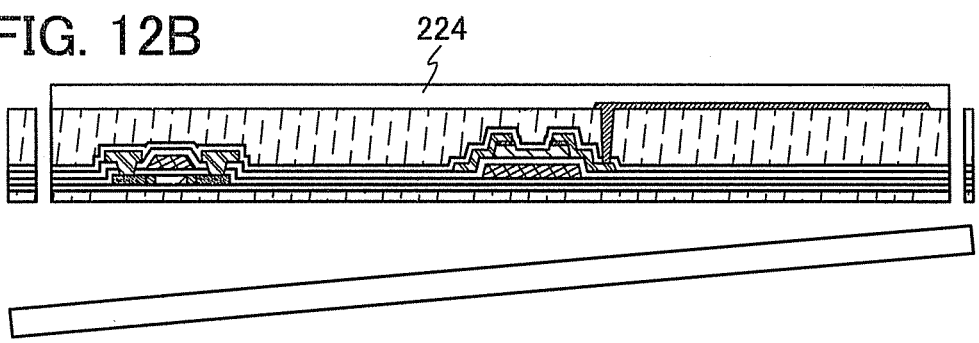

A support substrate 224 is attached to a surface where the insulating film 218 and the conductive layer 220 are formed, and an etchant (e.g., water) or the like is introduced into the planarized separation layer 178, whereby the first substrate 170 is separated (see FIG. 12B).

Figure 12C:
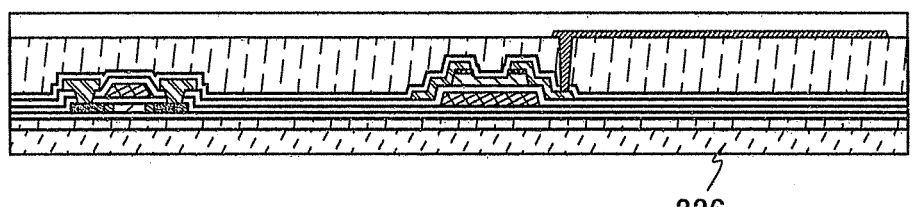

Next, a substrate 226 is attached to a side of the thus separated element which is opposite to the support substrate 224 side (see FIG. 12C). As the substrate 226, a flexible substrate may be used.

For the material of the flexible substrate, an aramid resin, a polyethylene naphthalate (PEN) resin, a polyether sulfone (PES) resin, a polyphenylene sulfide (PPS) resin, a polyimide (PI) resin, or the like can be used.

Figure 12D:
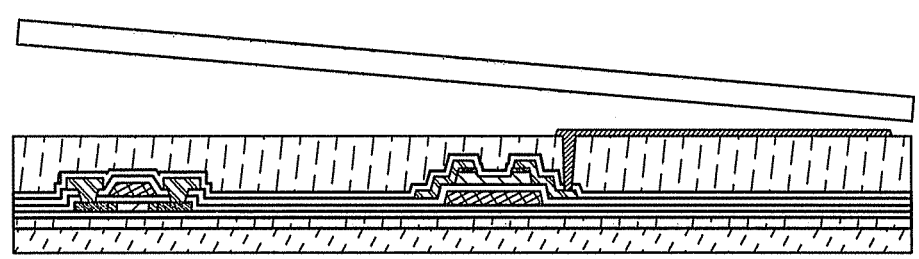

Next, the support substrate 224 is separated (see FIG. 12D).

Figure 12E:
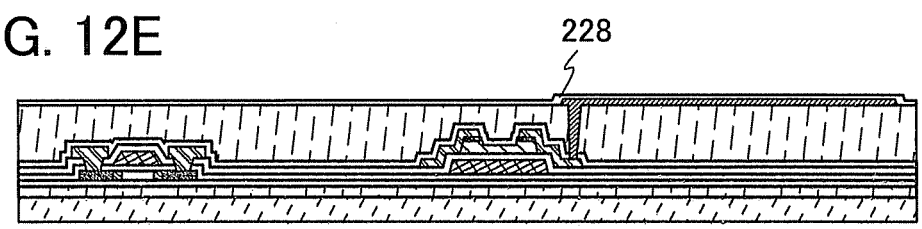

Next, an orientation film 228 is formed over a side from which the support substrate 224 has been separated (see FIG. 12E).

In a manner described above, a process on the element substrate side is completed. On the other hand, an electrode and the like are formed on the counter substrate side.

Figure 13A:
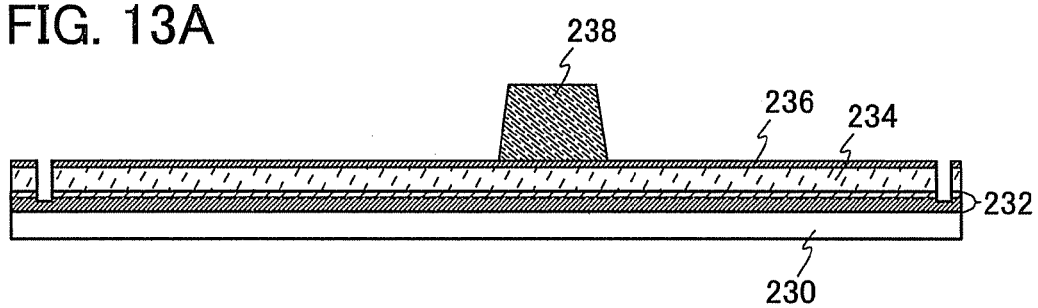
FIGS. 13A to 13C illustrate a method for manufacturing a display panel which is an embodiment of the present invention.

First, a separation layer 232 is formed over a substrate 230 in a manner similar to the element substrate side, and a substrate 234 is formed over the separation layer 232. A conductive layer 236 is formed over the substrate 234, and a spacer 238 is formed over the conductive layer 236 (see FIG. 13A).

Figure 13B:
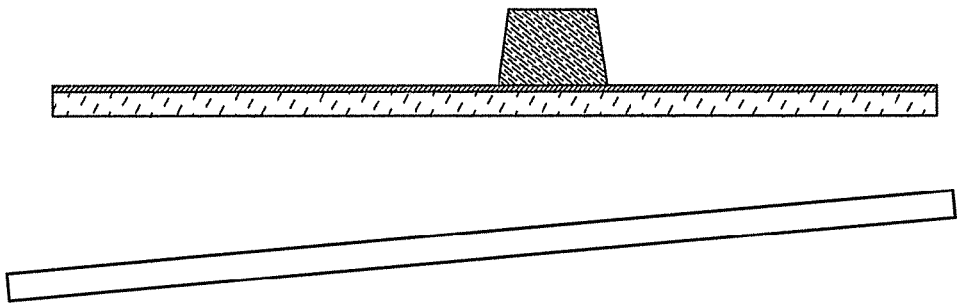

Next, an etchant (e.g., water) or the like is introduced into the separation layer 232, whereby the substrate 230 is separated (see FIG. 13B).

Figure 13C:
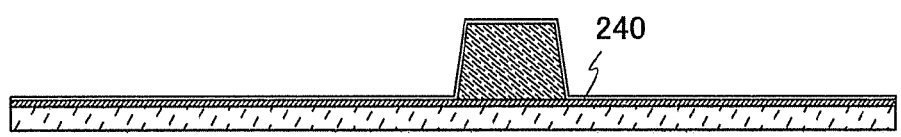

An orientation film 240 is formed over elements (the conductive layer 236 and the spacer 238) from which the substrate 230 has been separated (see FIG. 13C).

In a manner described above, a process on the counter substrate side is completed. Note that the present invention is not limited to the above-described process, and the counter substrate may be manufactured in a manner similar to the element substrate side.

The substrate 226 and the substrate 234 after the processes are completed as described above are attached together, and a liquid crystal material is introduced into a space between the substrate 226 and the substrate 234.

As thus described, a display panel can be manufactured using a liquid crystal display element in which a thin film transistor in a driver circuit portion is formed using a single crystal semiconductor while a thin film transistor in a pixel portion is formed using a semiconductor material other than a single crystal semiconductor.

Note that a method for transferring an element to another substrate is not limited in particular, and a method other than that described above may be used.

Note that in this embodiment, the structure of the transistor is not limited in particular. Thus, any of transistors with a variety of structures and a variety of semiconductor materials can be used. That is, either a top-gate thin film transistor or a bottom-gate thin film transistor may be used. In the case of using a top-gate thin film transistor, either a forward-staggered thin film transistor or a coplanar thin film transistor which is used for the driver circuit portion described above may be used. In the case of using a bottom-gate thin film transistor, either an inverted-staggered thin film transistor which is used for the display portion described above or an inverted-coplanar thin film transistor may be used.

In this embodiment, a thin film transistor with a single-gate structure is described. Note that the present invention is not limited to this. A double-gate structure in which gate electrodes formed by being separated from one metal layer or a dual-gate structure in which gate electrodes are formed over and under a semiconductor layer may also be used.

Note that a material for forming the semiconductor layer is not limited to a particular material.

The semiconductor layer included in the semiconductor element can be formed using any of the following materials: an amorphous semiconductor or a microcrystalline semiconductor manufactured by a sputtering method or a vapor-phase growth method using a semiconductor source gas typified by silane or germane; a polycrystalline semiconductor formed by crystallizing the amorphous semiconductor with the use of light energy or thermal energy; or the like. An amorphous semiconductor film can be formed by a sputtering method, an LPCVD method, a plasma CVD method, or the like.

The microcrystalline semiconductor belongs to a metastable state of an intermediate between amorphous and single crystal. That is, the microcrystalline semiconductor is a semiconductor having a third state that is stable in terms of free energy, having a short-range order and lattice distortion, and having column-like or needle-like crystals in the direction of a normal line with respect to a surface of the substrate. The peak of a Raman spectrum of microcrystalline silicon, which is a typical example of a microcrystalline semiconductor, is shifted toward lower wavenumber than 520 $cm^{-1}$ which represents single crystal silicon. That is, the peak of the Raman spectrum of the microcrystalline silicon lies between 520 $cm^{-1}$ which represents single crystal silicon and 480 $cm^{-1}$ which represents amorphous silicon. The microcrystalline semiconductor may contain hydrogen or halogen of at least 1 at. % to terminate dangling bonds. Moreover, a rare gas element such as helium, argon, krypton, or neon may be contained to further promote lattice distortion, so that the stability is enhanced and a favorable microcrystalline semiconductor film can be obtained.

The microcrystalline semiconductor can be formed by a high-frequency plasma CVD method with a frequency of several tens to several hundreds of megahertz or a microwave plasma CVD apparatus with a frequency higher than or equal to 1 GHz. For example, the microcrystalline semiconductor can be formed in such a manner that silicon hydride, typically, $SiH_4$, $Si_2H_6$, $SiH_2Cl_2$, $SiHCl_3$, $SiCl_4$, $SiF_4$, or the like is diluted with hydrogen. Alternatively, by dilution of silicon hydride and hydrogen with one or more kinds of rare gas elements selected from helium, argon, krypton, or neon, the microcrystalline semiconductor can be formed. The flow rate of hydrogen is greater than or equal to 5 times and less than or equal to 200 times, preferably greater than or equal to 50 times and less than or equal to 150 times, much more preferably 100 times as much as that of silicon hydride.

As an example of an amorphous semiconductor, hydrogenated amorphous silicon can be given, and as an example of a crystalline semiconductor, polycrystalline silicon or the like can be given. Here, polycrystalline silicon includes so-called high-temperature polysilicon, which is formed at process temperatures of 800° C. or higher; so-called low-temperature polysilicon, which is formed at process temperatures of 600° C. or lower; polysilicon which is formed by crystallizing amorphous silicon by using, for example, an element promoting crystallization; and the like.

As a semiconductor material, as well as a semiconductor material of an element of silicon, germanium, or the like, a compound semiconductor material such as GaAs, InP, SiC, ZnSe, GaN, or SiGe can be used.

In the case of using a crystalline semiconductor for the semiconductor material, the crystalline semiconductor film may be formed by any of various methods (such as a laser crystallization method, a thermal crystallization method, and a thermal crystallization method using an element promoting crystallization, such as nickel). Alternatively, a microcrystalline semiconductor film, the crystallinity of which is enhanced by laser irradiation, may be used. Further alternatively, when the element promoting crystallization is not introduced, for example, before irradiating an amorphous silicon film with laser light, the amorphous silicon film is heated at 500° C. for one hour under a nitrogen atmosphere to release hydrogen contained in the amorphous silicon film so that the concentration of hydrogen is reduced to $1\times10^{20}$ $cm^{-3}$ or lower.

Any method can be used for introducing a metal element into the amorphous semiconductor film as long as the method allows the metal element to exist on the surface of or inside the amorphous semiconductor film. For example, a sputtering method, a CVD method, a plasma process method (including a plasma CVD method), an adsorption method, a method of applying a solution of metal salt, or the like can be used. Among them, the method of using a solution is simple and can easily adjust concentration of the metal element. At this time, UV light irradiation in an oxygen atmosphere, thermal oxidation, treatment with ozone water or hydrogen peroxide, or the like may be performed in order to improve the wettability of the surface of the amorphous semiconductor film and to spread an aqueous solution over the entire surface of the amorphous semiconductor film.

Note that in a process in which an amorphous semiconductor film is crystallized to form a crystalline semiconductor film, an element promoting crystallization may be added to an amorphous semiconductor film and crystallization may be performed by heat treatment (for example, at 550° C. to 750° C. for 3 minutes to 24 hours). The element promoting crystallization can be one or more kinds of elements such as iron, nickel, cobalt, ruthenium, rhodium, palladium, osmium, iridium, platinum, copper, and gold.

In the case of forming polysilicon which is formed by crystallizing amorphous silicon with the use of an element promoting crystallization, a semiconductor film containing an impurity element is formed to be in contact with the crystalline semiconductor film and is made to function as a gettering sink in order to remove the element promoting crystallization from the crystalline semiconductor film. As such an impurity element, an impurity element imparting one conductivity type (either n-type conductivity or p-type conductivity), a rare gas element, or the like can be used. For example, one or more kinds of elements such as phosphorus, nitrogen, arsenic, antimony, bismuth, boron, helium, neon, argon, krypton, and xenon can be used. A rare gas element is contained in part of the crystalline semiconductor film containing the element promoting crystallization, and heat treatment (for example, 550° C. to 750° C. for 3 minutes to 24 hours) is performed. By the heat treatment, the element promoting crystallization in the crystalline semiconductor film moves into a part containing the rare gas element, and the element promoting crystallization in the crystalline semiconductor film is removed. Then, the part of the semiconductor film containing the rare gas element is removed.

The amorphous semiconductor film may be crystallized by a combination of heat treatment and laser irradiation or by several times of heat treatment or laser irradiation.

Note that the semiconductor material is not limited to silicon which is described above, or the like, and an oxide semiconductor may be used. For example, as the oxide semiconductor, zinc oxide (ZnO), tin oxide ($SnO_2$), or the like can be used. In the case where ZnO is used, $Y_2O_3$, $Al_2O_3$, $TiO_2$, a stacked layer thereof, or the like may be used for a gate insulating layer, and ITO, Au, Ti, or the like may be used for a gate electrode, a source electrode, and a drain electrode. In, Ga, or the like may be added to ZnO.

Alternatively, as the oxide semiconductor, a thin film expressed by $InMO_3(ZnO)_m$ (m>0, where m is not necessarily an integer) can be used. Note here that M denotes a single metal element or a plurality of metal elements selected from gallium (Ga), iron (Fe), nickel (Ni), manganese (Mn), and cobalt (Co). As an example, M may be Ga or may include the above metal element in addition to Ga, for example, M may be Ga and Ni or Ga and Fe. The oxide semiconductor may contain a transition metal element such as Fe or Ni or oxide of the transition metal element as an impurity element in addition to the metal element contained as M. For example, an In—Ga—Zn—O-based non-single-crystal film can be used for an oxide semiconductor layer.

Instead of the In—Ga—Zn—O-based non-single-crystal film, an $InMO_3(ZnO)_m$ (m>0, where m is not necessarily an integer) film in which M is any of metal elements other than those described above may be used as the oxide semiconductor ($InMO_3(ZnO)_m$ (m>0)) layer. As the oxide semiconductor used for the oxide semiconductor layer, any of the following oxide semiconductors can be used besides the above: an In—Sn—Zn—O based oxide semiconductor; an In—Al—Zn—O based oxide semiconductor; a Sn—Ga—Zn—O based oxide semiconductor; an Al—Ga—Zn—O based oxide semiconductor; a Sn—Al—Zn—O based oxide semiconductor; an In—Zn—O based oxide semiconductor; a Sn—Zn—O based oxide semiconductor; an Al—Zn—O based oxide semiconductor; an In—O based oxide semiconductor; a Sn—O based oxide semiconductor; and a Zn—O based oxide semiconductor.

As a semiconductor element provided in a circuit portion of the display device, not only a field-effect transistor but also a memory element and the like can be employed; accordingly, a semiconductor integrated circuit having functions required for various applications can be provided.

Note that without limitation to the above description, an element may be directly formed over a flexible substrate. Further, a method for forming the LTSS layer is also not limited to the above-described method.

Note that particularly in the case of a light-emitting device, a display device with a support substrate may be completed without separation of a support substrate.

Further, the transfer method described above and the method for directly forming an element over a flexible substrate may be combined. For example, a wiring for electrically connecting a display portion, a scan line driver circuit portion, an FPC, and the like may be directly formed over a flexible substrate of a display panel by a printing method or the like.

Note that for the process of transferring the element to another substrate, any of the following methods can be used as appropriate: (1) a method in which a separation layer is formed between a substrate and an element, a metal oxide film is provided between the separation layer and the element, and the metal oxide film is embrittled by crystallization, thereby separating the element; (2) a method in which an amorphous silicon film containing hydrogen is provided between a substrate and an element, and the amorphous silicon film is removed by laser light irradiation or etching, thereby separating the element; (3) a method in which a separation layer is formed between a substrate and an element, a metal oxide film is provided between the separation layer and the element, the metal oxide film is embrittled by crystallization, part of the separation layer is removed by etching using a solution or a fluoride halogen gas such as $NF_3$, $BrF_3$, or $ClF_3$, and then the element is separated at the embrittled metal oxide film; (4) a method in which a substrate over which an element is formed is mechanically removed or is removed by etching using a solution or a fluoride halogen gas such as $NF_3$, $BrF_3$, or $ClF_3$; and the like.

Alternatively, it is also possible to use a method in which a film containing nitrogen, oxygen, hydrogen, or the like (e.g., an amorphous silicon film containing hydrogen, a film of an alloy containing hydrogen, or a film of an alloy containing oxygen) is used as a separation layer, which is irradiated with a laser beam so that nitrogen, oxygen, or hydrogen contained in the separation layer is released as a gas to promote separation between an element layer and a substrate.

When two or more separation methods described above are combined together, the transfer process can be conducted easily. That is, separation can also be conducted with physical force (e.g., by a machine or the like) after making it easier for the separation layer and an element to be separated from each other by laser irradiation, etching of the separation layer with a gas, a solution, or the like and/or mechanical separation using a keen knife or the like.

Alternatively, the interface between the separation layer and the element may be soaked with an etchant (a liquid), whereby the element layer may be separated from the substrate. As the etchant, water or the like can be used, for example.

As described above, a display panel which is an embodiment of the present invention can be manufactured.

Note that the present invention is not limited to the above description, and in an embodiment of the present invention, the driver circuit portion is not necessarily provided over the same substrate as the pixel portion. The driver circuit portion may be formed over another substrate and connected to the pixel portion.

Note that "semiconductor device" in this embodiment includes, in the category, general devices that can function by use of semiconductor characteristics. Thus, electro-optical devices, semiconductor circuits, and electronic devices are all included in the category of the semiconductor device. Therefore, the display panel of this embodiment is also included in the category of the semiconductor device.

Embodiment 2

In this embodiment, an embodiment of the present invention which is different from Embodiment 1 will be described.

One side of a rectangular display panel which is described in Embodiment 1 may be bound to a binding portion. By binding the display panel to the binding portion, the binding portion can serve as a spine of a book (see FIGS. 14A to 14C).

Figure 14A:
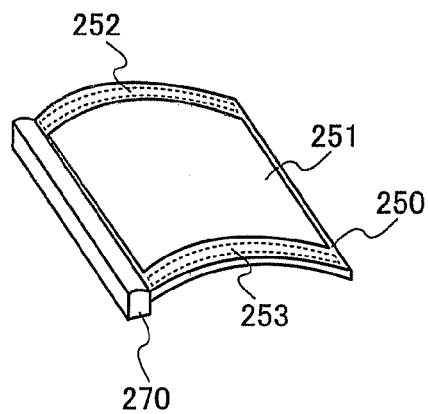
FIGS. 14A to 14C illustrate an electronic book which is an embodiment of the present invention.
Figure 14B:
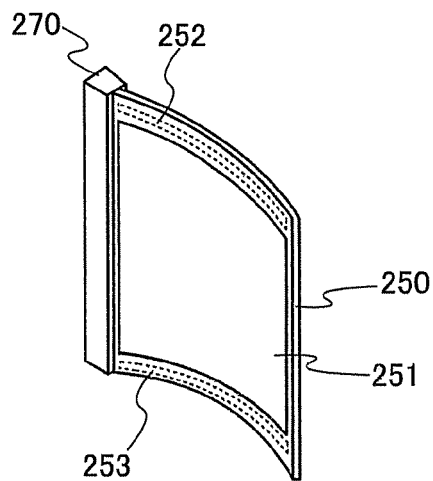
Figure 14C:
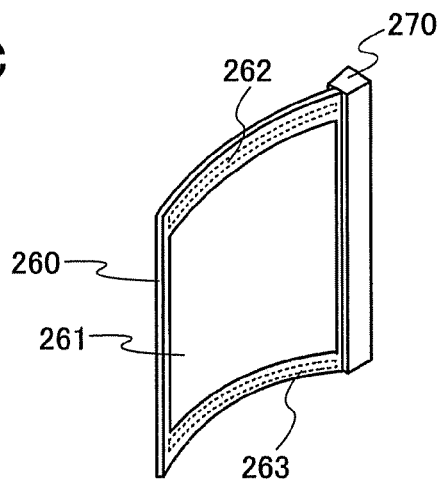

An electronic book illustrated in FIGS. 14A to 14C includes a first display panel 250 having a first display portion 251, a second display panel 260 having second display portion 261, a binding portion 270 which binds end portions of the first display panel 250 and the second display panel 260, a first scan line driver circuit 252 and a second scan line driver circuit 253 which control display of the first display portion 251, a third scan line driver circuit 262 and a fourth scan line driver circuit 263 which control display of the second display portion 261, and a signal line driver circuit which controls display of the first display portion 251 and the second display portion 261. Note that the signal line driver circuit not shown is preferably provided in the binding portion 270.

Further, with the use of the binding portion binding the display panel, a plurality of panels can be bound to the binding portion. Thus, an electronic book with a plurality of pages can be manufactured (see FIG. 15).

Figure 15:
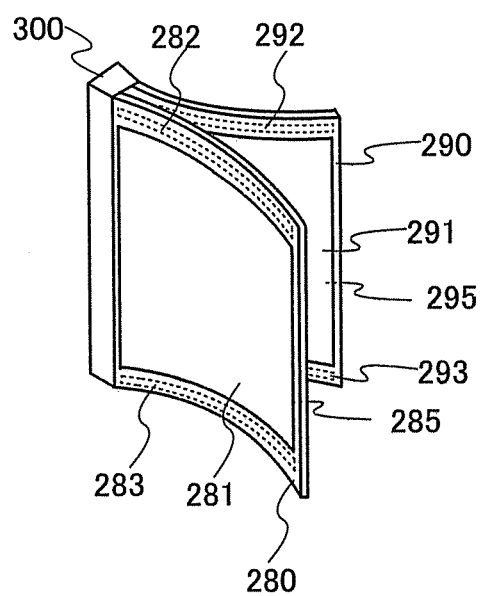
FIG. 15 illustrates an electronic book which is an embodiment of the present invention.

An electronic book illustrated in FIG. 15 includes a first display panel 280 having a first display portion 281, a second display panel 285 having a second display portion (not shown), a third display panel 290 having a third display portion 291, a fourth display panel 295 having a fourth display portion (not shown), a binding portion 300 which binds end portions of the first to fourth display panels, a first scan line driver circuit 282 and a second scan line driver circuit 283 which control display of the first display portion 281, a third scan line driver circuit (not shown) and a fourth scan line driver circuit (not shown) which control display of a second display portion (not shown), a fifth scan line driver circuit 292 and a sixth scan line driver circuit 293 which control display of the third display portion 291, a seventh scan line driver circuit (not shown) and an eighth scan line driver circuit (not shown) which control display of the fourth display portion (not shown), and first to fourth signal line driver circuits which control display of the first to fourth display portions. The signal line driver circuits not shown are preferably provided in the binding portion 300.

An electronic book having a plurality of pages formed using a plurality of display panels can be handled in a manner similar to a conventional book. Thus, an electronic book which can be comfortably used can be provided.

This application is based on Japanese Patent Application serial no. 2009-184308 filed with Japan Patent Office on Aug. 7, 2009, the entire contents of which are hereby incorporated by reference.

What is claimed is:

1. A display panel comprising:
   a flexible display portion in which a scan line and a signal line intersect with each other, the flexible display portion being supported by a substrate;
   a signal line driver circuit for outputting a first signal to the signal line adjacent to a first side of the flexible display portion, the signal line driver circuit being supported by the substrate; and
   a scan line driver circuit for outputting a second signal to the scan line adjacent to a second side of the flexible display portion, the scan line driver circuit being supported by the substrate;
   wherein vicinities of four corners of the display panel has a higher mechanical strength than the vicinity of four sides except the vicinities of four corners.

2. The display panel according to claim 1, wherein the display panel further comprises a second signal line driver circuit for outputting the first signal to the signal line adjacent to a third side of the flexible display portion opposite to the first side over the substrate.

3. The display panel according to claim 1, wherein the display panel further comprises a second scan signal line driver circuit for outputting the second signal to the scan line adjacent to a fourth side of the flexible display portion opposite to the second side over the substrate.

4. The display panel according to claim 1, wherein the scan line driver circuit is approximately perpendicular to the signal line driver circuit.

5. The display panel according to claim 1,
   wherein the display panel is covered with a film, and
   wherein a portion of the film covering at least one of the signal line driver circuit and the scan line driver circuit is thicker than a portion of the film covering the flexible display portion.

6. The display panel according to claim 1,
   wherein one of or both the signal line driver circuit and the scan line driver circuit is provided with a thin film transistor formed using a single crystal semiconductor layer.

7. An electronic book comprising a plurality of display panels according to claim 1.

8. A display panel comprising:
   a flexible display portion displaying an image only on one display surface in which a scan line and a signal line intersect with each other, the flexible display portion being supported by a substrate;
   a signal line driver circuit for outputting a first signal to the signal line adjacent to a first side of the flexible display portion, the signal line driver circuit being supported by the substrate; and
   a scan line driver circuit for outputting a second signal to the scan line adjacent to a second side of the flexible display, the scan line driver circuit being supported by the substrate;

wherein vicinities of four corners of the display panel has a higher mechanical strength than the vicinity of four sides except the vicinities of four corners.

9. The display panel according to claim 8, wherein the display panel further comprises a second signal line driver circuit for outputting the first signal to the signal line adjacent to a third side of the flexible display portion opposite to the first side over the substrate.

10. The display panel according to claim 8, wherein the display panel further comprises a second scan signal line driver circuit for outputting the second signal to the scan line adjacent to a fourth side of the flexible display portion opposite to the second side over the substrate.

11. The display panel according to claim 8, wherein the scan line driver circuit is approximately perpendicular to the signal line driver circuit.

12. The display panel according to claim 8,
wherein the display panel is covered with a film, and
wherein a portion of the film covering the vicinity of four sides of the display panel is thicker than other than the vicinity of four sides of the display panel.

13. The display panel according to claim 8,
wherein one of or both the signal line driver circuit and the scan line driver circuit is provided with a thin film transistor formed using a single crystal semiconductor layer.

14. An electronic book comprising a plurality of display panels according to claim 8.

15. The display panel according to claim 1,
wherein each of the flexible display portion, the signal line driver circuit, and the scan line driver circuit includes a first transistor, a second transistor, and a third transistor, respectively, and
wherein the first transistor, the second transistor, and the third transistor are formed by a same process.

16. The display panel according to claim 8,
wherein each of the flexible display portion, the signal line driver circuit, and the scan line driver circuit includes a first transistor, a second transistor, and a third transistor, respectively, and
wherein the first transistor, the second transistor, and the third transistor are formed by a same process.

* * * * *